(12) United States Patent
Kim et al.

(10) Patent No.: US 11,657,860 B2
(45) Date of Patent: May 23, 2023

(54) MEMORY PACKAGE AND STORAGE DEVICE INCLUDING THE SAME

(71) Applicant: Samsung Electronics Co., Ltd., Suwon-si (KR)

(72) Inventors: Joohwan Kim, Suwon-si (KR); Jindo Byun, Suwon-si (KR); Younghoon Son, Yongin-si (KR); Youngdon Choi, Seoul (KR); Junghwan Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 21 days.

(21) Appl. No.: 17/361,780

(22) Filed: Jun. 29, 2021

(65) Prior Publication Data

US 2022/0157353 A1    May 19, 2022

(30) Foreign Application Priority Data

Nov. 16, 2020   (KR) ........................ 10-2020-0152800

(51) Int. Cl.
*G11C 7/08*    (2006.01)
*G11C 7/10*    (2006.01)
(Continued)

(52) U.S. Cl.
CPC .......... *G11C 7/1084* (2013.01); *G06F 3/0656* (2013.01); *G06F 3/0679* (2013.01); *G11C 7/222* (2013.01)

(58) Field of Classification Search
CPC ..... H01L 2225/107; H01L 2924/15192; H01L 2924/15311; H01L 2924/19107;
(Continued)

(56) References Cited

U.S. PATENT DOCUMENTS 7,679,133 B2    3/2010   Son et al.
8,553,466 B2   10/2013   Han et al.
(Continued)

FOREIGN PATENT DOCUMENTS

KR    10-2014-0088730 A    7/2014

OTHER PUBLICATIONS

Extended European Search Report for European Patent Application No. 21195302.1 dated Feb. 25, 2022.

*Primary Examiner* — Huan Hoang
*Assistant Examiner* — Minh Dinh
(74) *Attorney, Agent, or Firm* — Harness, Dickey & Pierce, P.L.C.

(57) ABSTRACT

A memory package includes a package substrate including a redistribution layer and bonding pads connected to the redistribution layer, the redistribution layer including a plurality of signal paths; a buffer chip mounted on the package substrate and including a plurality of chip pads corresponding to a plurality of memory channels; and a plurality of memory chips stacked on the package substrate and divided into a plurality of groups corresponding to the plurality of memory channels, wherein memory chips of a first group, among the plurality of memory chips, are connected to first chip pads of the plurality of chip pads through first wires, and wherein memory chips of a second group, among the plurality of memory chips, are connected to second chip pads of the plurality of chip pads through second wires and at least a portion of the plurality of signal paths.

20 Claims, 17 Drawing Sheets

(51) Int. Cl.
*G06F 3/06* (2006.01)
*G11C 7/22* (2006.01)

(58) Field of Classification Search
CPC . H01L 23/5386; H01L 23/481; H01L 23/525; H01L 24/06; H01L 24/09; H01L 24/46; H01L 24/49; H01L 27/11556; H01L 27/11582
USPC .................................................. 365/189.05
See application file for complete search history.

(56) References Cited

U.S. PATENT DOCUMENTS

| | | | |
|---|---|---|---|
| 8,559,235 B2 | 10/2013 | Yoon et al. | |
| 8,654,587 B2 | 2/2014 | Yoon et al. | |
| 8,680,687 B2 | 3/2014 | Co et al. | |
| 10,262,972 B2* | 4/2019 | Lee | H01L 25/0652 |
| 10,522,507 B2 | 12/2019 | Ng et al. | |
| 2007/0088995 A1 | 4/2007 | Tsern et al. | |
| 2008/0126690 A1 | 5/2008 | Rajan et al. | |
| 2011/0233648 A1 | 9/2011 | Seol et al. | |
| 2012/0294058 A1 | 11/2012 | Best et al. | |
| 2014/0124956 A1 | 5/2014 | Lee | |
| 2014/0185389 A1* | 7/2014 | Jeon | G11C 7/222 365/189.05 |
| 2015/0046612 A1 | 2/2015 | Gupta | |
| 2016/0117110 A1 | 4/2016 | Jeon et al. | |
| 2016/0181214 A1* | 6/2016 | Oh | H01L 27/222 257/777 |
| 2017/0170156 A1 | 6/2017 | Hong et al. | |
| 2019/0384491 A1 | 12/2019 | Park | |
| 2020/0272560 A1 | 8/2020 | Keeth et al. | |
| 2021/0090612 A1* | 3/2021 | Park | G11C 5/025 |
| 2021/0111152 A1* | 4/2021 | Park | H01L 25/0652 |
| 2021/0327844 A1* | 10/2021 | Lo | H01L 25/0655 |

\* cited by examiner

MEMORY PACKAGE AND STORAGE DEVICE INCLUDING THE SAME

CROSS TO REFERENCE TO RELATED APPLICATION(S)

This application claims benefit of priority to Korean Patent Application No. 10-2020-0152800 filed on Nov. 16, 2020 in the Korean Intellectual Property Office, the disclosure of which is incorporated herein by reference in its entirety.

BACKGROUND

Example embodiments of the present disclosure relate to a memory package and a storage device including the same.

The memory package may include a plurality of memory chips mounted on a package substrate, and the storage device may include one or more memory packages. The storage device may include a device controller for controlling a memory package, and the device controller may control a plurality of memory chips through a buffer chip included in the memory package. As a data storage space required for various electronic devices increases, demand for a memory package in which a buffer chip and memory chips are efficiently disposed, and a storage device, has gradually increased.

SUMMARY

At least one example embodiment of the present disclosure is to provide a memory package in which memory chips are effectively connected to each other using a redistribution layer of a package substrate and/or a system substrate, and a storage device.

According to at least one example embodiment of the present disclosure, a memory package includes a package substrate including a redistribution layer and bonding pads connected to the redistribution layer, the redistribution layer including a plurality of signal paths; a buffer chip mounted on the package substrate and including a plurality of chip pads corresponding to a plurality of memory channels; and a plurality of memory chips stacked on the package substrate and divided into a plurality of groups corresponding to the plurality of memory channels, wherein memory chips of a first group, among the plurality of memory chips, are connected to first chip pads of the plurality of chip pads through first wires, and wherein memory chips of a second group, among the plurality of memory chips, are connected to second chip pads of the plurality of chip pads through second wires and at least a portion of the signal paths.

According to at least one example embodiment of the present disclosure, a storage device includes a system substrate; device controller circuitry mounted on the system substrate; and a plurality of memory packages mounted on the system substrate and configured to operate in response to a control command received from the device controller circuitry, wherein each of the plurality of memory packages includes a package substrate connected to the system substrate, a single buffer chip mounted on the package substrate and configured to receive the control command from the device controller circuitry, and output the control command to at least one of a plurality of channels, and a plurality of memory chips connected to the buffer chip through the plurality of memory channels, wherein memory chips of a first group, among the plurality of memory chips, are electrically connected to the buffer chip through first wires, and wherein memory chips of a second group, among the plurality of memory chips, are electrically connected to the buffer chip through second wires and a redistribution layer disposed in the package substrate.

According to at least one example embodiment of the present disclosure, a storage device includes a system substrate including a redistribution layer; device controller circuitry mounted on the system substrate; and a plurality of memory packages mounted on the system substrate and configured to operate in response to a control command received from the device controller circuitry, wherein each of the memory packages includes a package substrate connected to the system substrate and including a plurality of bonding pads, and a plurality of memory chips mounted on the package substrate, wherein at least one of the memory packages includes a buffer chip connected to the memory chips through a plurality of channels and transmitting the control command received from the device controller circuitry to the memory chips through at least one of the channels, wherein the buffer chip includes a plurality of chip pads, and wherein at least one of the chip pads is connected to the memory chips of a memory package which does not include the buffer chip among the memory packages through wires and the redistribution layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
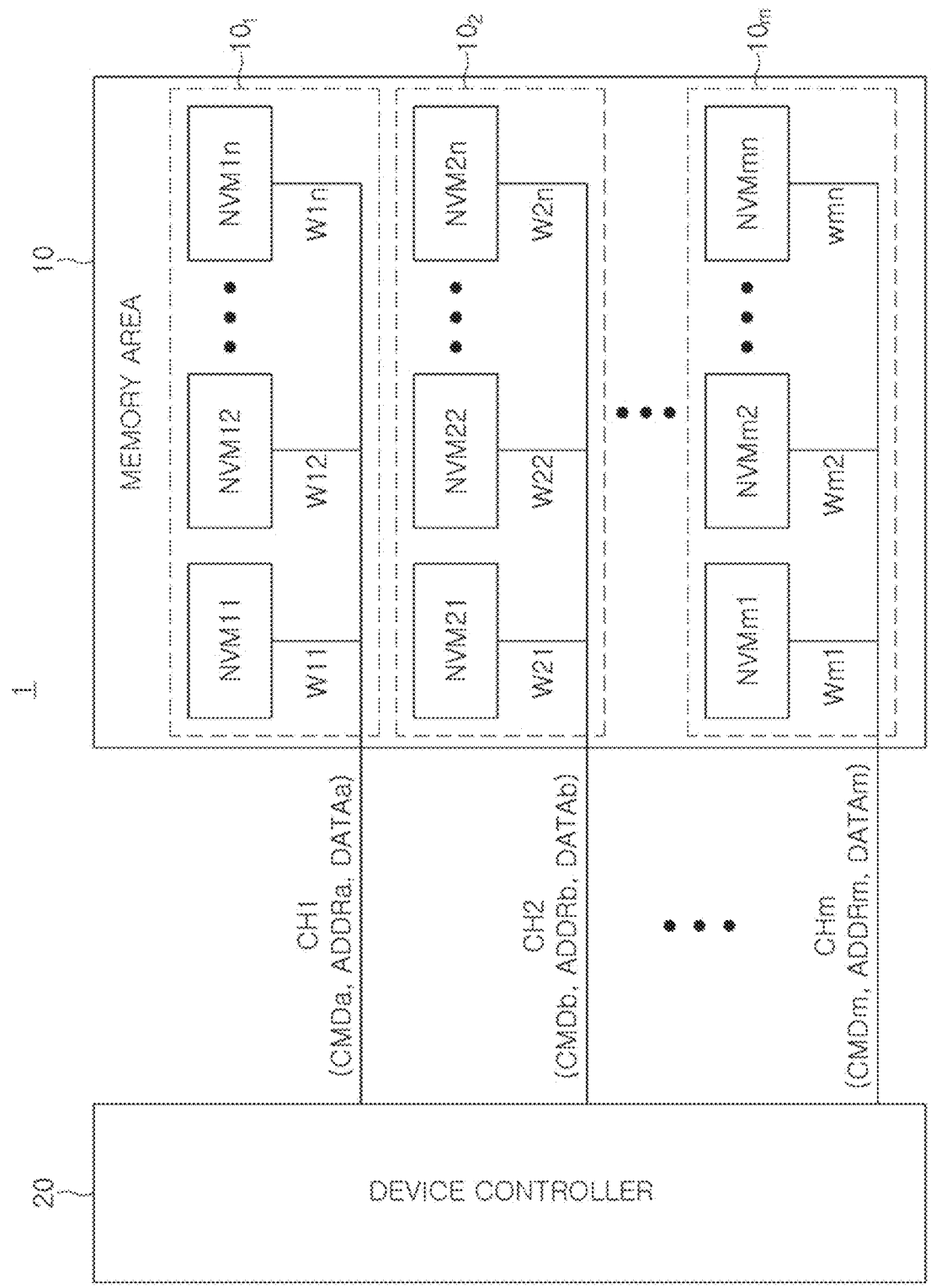
FIGS. 1 and 2 are views illustrating a storage device according to at least one example embodiment of the present disclosure.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Figure 2:
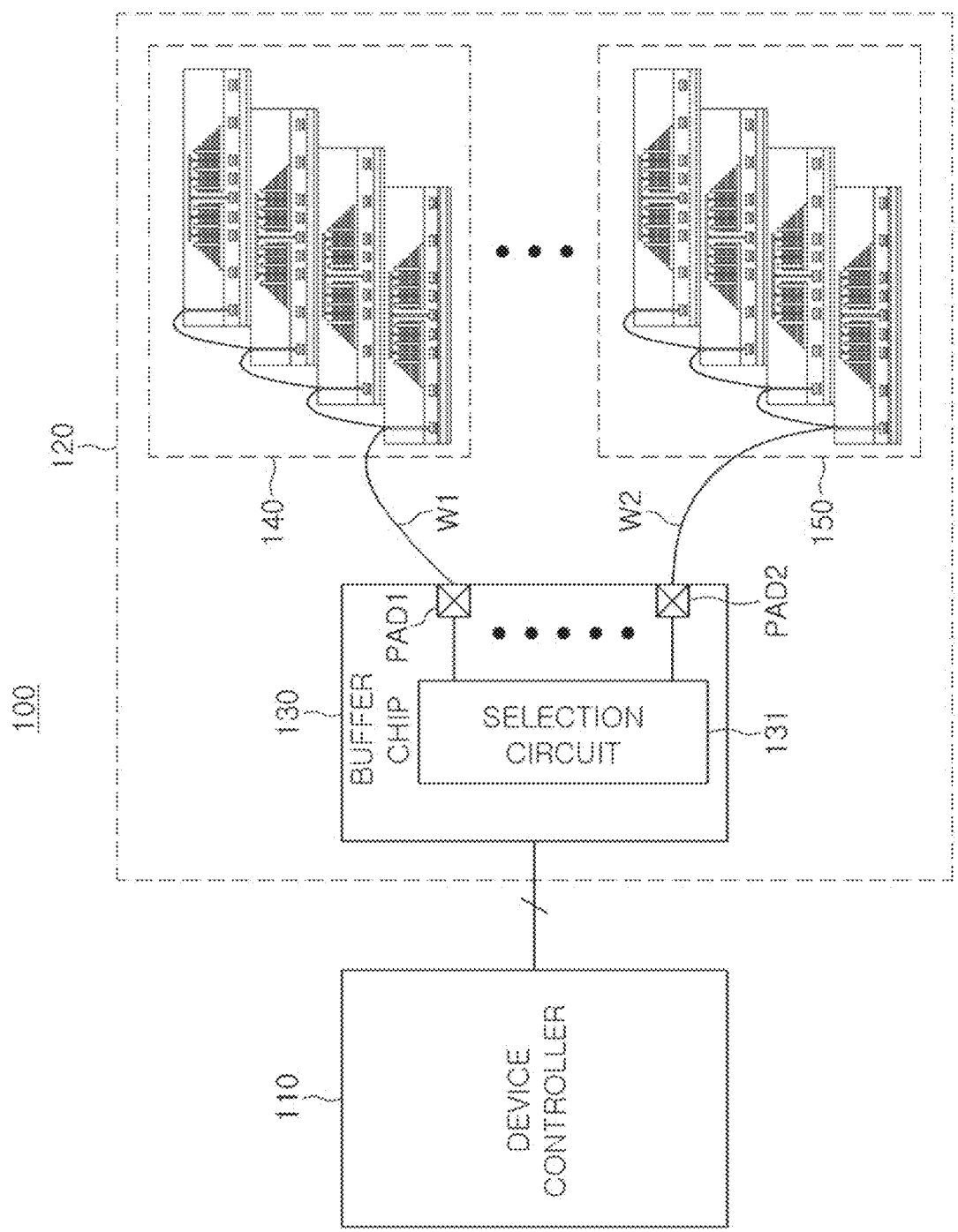

FIGS. 1 and 2 are views illustrating a storage device according to at least one example embodiment.

Referring to FIG. 1, a storage device 1 may include a memory area 10 and a device controller 20. The device controller 20 may be configured as a memory controller for controlling operations of the memory area 10. The storage device 1 may support a plurality of channels CH1 to CHm, and the memory area 10 and the memory controller 20 may be connected to each other through a plurality of channels CH1 to CHm. For example, the storage device 1 may include a solid state drive (SSD) device.

The memory area 10 may include a plurality of memory packages $10_1$ to $10_m$. The plurality of memory packages $10_1$ to $10_m$ may be connected to the device controller 20 through the plurality of channels CH1 to CHm, and each of the plurality of memory packages $10_1$ to $10_m$ may include a plurality of memory devices NVM11 to NVMmn. Each of the plurality of memory devices NVM11 to NVMmn may be connected to one of the plurality of channels CH1 to CHm through a corresponding way. For example, the memory devices NVM11 to NVM1n included in the first memory package $10_1$ may be connected to the first channel CH1 through the ways W11 to W1n, and the memory devices NVM21 to NVM2n included in the second memory package $10_2$ may be connected to the second channel CH2 through ways W21 to W2n.

In at least one example embodiment, each of the plurality of memory devices NVM11 to NVMmn may be implemented as an arbitrary memory unit operating according to an individual command from the device controller 20. For example, each of the plurality of memory devices NVM11 to NVMmn may be implemented as a chip or a die. However, example embodiments are not limited thereto. When each of the plurality of memory devices NVM11 to NVMmn is implemented as a chip or a die, the plurality of memory devices NVM11 to NVMmn may be alternately stacked in each of the plurality of memory packages $10_1$ to $10_m$.

The device controller 20 may transmit signals to and receive signals from the memory area 10 through the plurality of channels CH1 to CHm. For example, the device controller 20 may transfer commands CMDa to CMDm, addresses ADDRa to ADDRm, and data DATAa to DATAm to the memory area 10 or may receive data DATAa to DATAm from the memory area 10 through the plurality of channels CH1 to CHm.

In at least one example embodiment, at least one of the plurality of memory packages $10_1$ to $10_m$ may include a buffer chip, and the buffer chip may transfer a signal between the plurality of memory devices NVM11 to NVMmn and the device controller 20. For example, in a program operation, the device controller 20 may transmit data to be stored in the memory area 10 and an address signal to the buffer chip. The buffer chip may transmit data to one of the plurality of memory devices NVM11 to NVMmn based on the address signal.

When at least one of the plurality of memory packages $10_1$ to $10_m$ includes a buffer chip, the buffer chip may output data and an address signal to at least one of the plurality of channels CH1 to CHm in response to the data and the address signals transmitted by the device controller 20 to the buffer chip. In other words, the buffer chip may branch and provide a signal transmission path between the device controller 20 and the plurality of memory devices NVM11 to NVMmn.

The device controller 20 may select one of non-volatile memory devices connected to a corresponding channel through each channel and may transmit signals to and may receive signals from the selected non-volatile memory device. For example, the memory controller 20 may select the non-volatile memory device NVM11 from among the non-volatile memory devices NVM11 to NVM1n connected to the first channel CH1. The memory controller 20 may transmit the command CMDa, the address ADDRa, and the data DATAa to the selected non-volatile memory device NVM11 or may receive the Data DATAa from the selected non-volatile memory device NVM11 through the first channel CH1.

The device controller 20 may transmit signals to and receive signals from the memory area 10 in parallel through different channels. For example, the device controller 20 may transmit the command CMDb to the second memory package $10_2$ through the second channel CH2 while transmitting the command CMDa to the first memory package $10_1$ through the first channel CH1. To this end, each of the first memory package $10_1$ and the second memory package $10_2$ may include a buffer chip. Alternatively, the device controller 20 may transmit simultaneously the commands CMDa and CMDb through the first channel CH1 and the second channel CH2 through a single buffer chip shared by the first memory package $10_1$ and the second memory package $10_2$. For example, while the device controller 20 receives the data DATAa from the first memory package 101 through the first channel CH1, the device controller 20 may receive the data DATAb from the second memory package 102 through the second channel CH2.

The device controller 20 may control overall operation of the memory area 10. The device controller 20 may control each of the plurality of memory devices NVM11 to NVMmn connected to the plurality of channels CH1 to CHm by transmitting signals to the plurality of channels CH1 to CHm. For example, the device controller 20 may control one selected from among the plurality of memory devices NVM11 to NVM1n by transmitting the command CMDa and the address ADDRa through the first channel CH1.

Each of the plurality of memory devices NVM11 to NVMmn may operate under control of the device controller 20. For example, the memory device NVM11 may program the data DATAa according to the command CMDa, the address ADDRa, and the data DATAa provided through the first channel CH1. For example, the memory device NVM21 may read the data DATAb according to the command CMDb and the address ADDRb provided through the second channel CH2, and may transmit the readout data DATAb to the device controller 20.

FIG. 1 illustrates the example in which the memory area 10 may communicate with the device controller 20 through m number of channels, and that the memory area 10 may include n number of non-volatile memory devices corresponding to each channel. The number of channels and the number of memory devices connected to a single channel may be varied.

FIG. 2 may be a view illustrating the storage device 100 according to at least one example embodiment. Referring to FIG. 2, the storage device 100 may include a device controller 110 and a memory package 120.

The device controller 110 may be or include processing circuitry such as hardware including logic circuits; a hardware/software combination executing software; or a combination thereof. For example, the processing circuitry more specifically may include, but is not limited to, one or more of a central processing unit (CPU), a processor core, an arithmetic logic unit (ALU), a digital signal processor, a microcomputer, a field programmable gate array (FPGA), a programmable logic unit, a microprocessor, an application-specific integrated circuit (ASIC), etc.

The processing circuitry of the device controller 110 may be configured, via hardware and/or software (e.g., firmware), to perform and/or control any operation described in the specification as being performed by a device controller or an element thereof. The device controller 110 may also be referred to in the present specification as device controller circuitry 110.

The memory package 120 may include a buffer chip 130 and a plurality of memory chips, and the plurality of memory chips may be divided into a plurality of groups 140 and 150. In the example embodiment illustrated in FIG. 2, the number of memory chips included in each of the groups 140 and 150 is the same, but differently from the example, the number of memory chips included in at least a portion of the groups 140 and 150 may be different.

Memory chips included in each of the plurality of groups 140 and 150 may be connected to the buffer chip 130 through different paths. For example, a plurality of memory chips included in the first group 140 may be connected to each other through a first wire W1 and may also be connected to the buffer chip 130. In FIG. 2, the first wire W1 is illustrated as a single wire, however, the first wire W1 may include a plurality of wires. A plurality of memory chips included in the second group 150 may be connected to each other through a second wire W2 and may also be connected to the buffer chip 130. As similar to the first wire W1, the second wire W2 may include a plurality of wires. In other words, although illustrated schematically in FIG. 2, to connect each of the first group 140 and the second group 150 to the buffer chip 130, a plurality of the first wires W1 and a plurality of the second wires W2 may be provided. Also, in example embodiments, memory chips may be connected to each other by a connection means other than the wires W1 and W2, or the memory chips may be connected to the buffer chip 130. For example, the memory chips of the first group 140 may be connected to each other through a through silicon via (TSV), and may be connected to the buffer chip 130 through a first wire W1.

The buffer chip 130 may be configured to mediate signal exchange between the device controller 110 and the memory package 120. The buffer chip 130 may be connected to the wires W1 and W2 through a plurality of chip pads PAD1 and PAD2. Although illustrated schematically in FIG. 2, each of the first chip pad PAD1 and the second chip pad PAD2 may include a plurality of chip pads. The plurality of chip pads PAD1 and PAD2 may be connected to the selection circuit 131, and the selection circuit 131 may select at least one of the plurality of chip pads PAD1 and PAD2 according to a command from the device controller 110.

The buffer chip 130 may be or include processing circuitry such as hardware including logic circuits; a hardware/software combination executing software; or a combination thereof. For example, the processing circuitry more specifically may include, but is not limited to, one or more of a central processing unit (CPU), a processor core, an arithmetic logic unit (ALU), a digital signal processor, a microcomputer, a field programmable gate array (FPGA), a programmable logic unit, a microprocessor, an application-specific integrated circuit (ASIC), etc.

The processing circuitry of the buffer chip 130 may be configured, via hardware and/or software (e.g., firmware), to perform and/or control any operation described in the specification as being performed by a buffer chip or an element thereof (e.g., the selection circuit 131).

As an example, the device controller 110 may transmit an address signal for selecting at least one of the memory chips included in the first group 140 and the memory chips included in the second group 150 to the buffer chip 130. The buffer chip 130 may select at least one of the first chip pad PAD1 and the second chip pad PAD2 based on the address signal, and may transmit data to the memory chips or may receive data output from the memory chips. When the storage device 100 supports a multi-channel operation for reducing latency, the address signal generated by the device controller 110 and a control command corresponding the signal may be simultaneously transmitted to the first group 140 and the second group 150.

For example, when the device controller 110 generates a control command to execute a control operation such as a program operation or a read operation, the control command may include address information designating a memory chip for executing the control operation. The selection circuit 131 of the buffer chip 130 may select at least one of the plurality of chip pads PAD1 and PAD2 and may not select the others according to address information included in the control command.

In example embodiments, at least one of a transmitter for exporting data and/or signals to the memory chips and a receiver for receiving data from the memory chip may be connected to each of the plurality of chip pads PAD1 and PAD2. The selection circuit 131 may select at least one of the plurality of chip pads PAD1 and PAD2 based on the address information received from the device controller 110, and may activate a transmitter and/or a receiver connected to the selected at least one chip pad. Also, the selection circuit may deactivate a transmitter and a receiver connected to an unselected chip pad among the plurality of chip pads PAD1 and PAD2.

As an example, the selection circuit 131 may include a multiplexer and a demultiplexer. Accordingly, the selection circuit 131 may selectively transmit data and signals received from the device controller 110 to a plurality of memory chips divided into N number of groups (N is a natural number of 2 or greater). In at least one example embodiment, data and signals may be selectively transmitted to the plurality of memory chips divided into three or more groups through a single buffer chip 130, and accordingly, the storage device 100 having high capacity may be implemented without increasing the numbers of the buffer chip 130 and the device controller 110.

In at least one example embodiment, the storage device 100 may include a plurality of memory packages, and only a portion of the plurality of memory packages may include the buffer chip 130. In some example embodiments, memory chips of a memory package not including the buffer chip 130 may be connected to the device controller 110 through the buffer chip 130 of another memory package. Accordingly, without changing a design of the device controller 110, by increasing the number of memory packages connected to the device controller 110, the storage device 100 having high capacity may be implemented.

Figure 3:
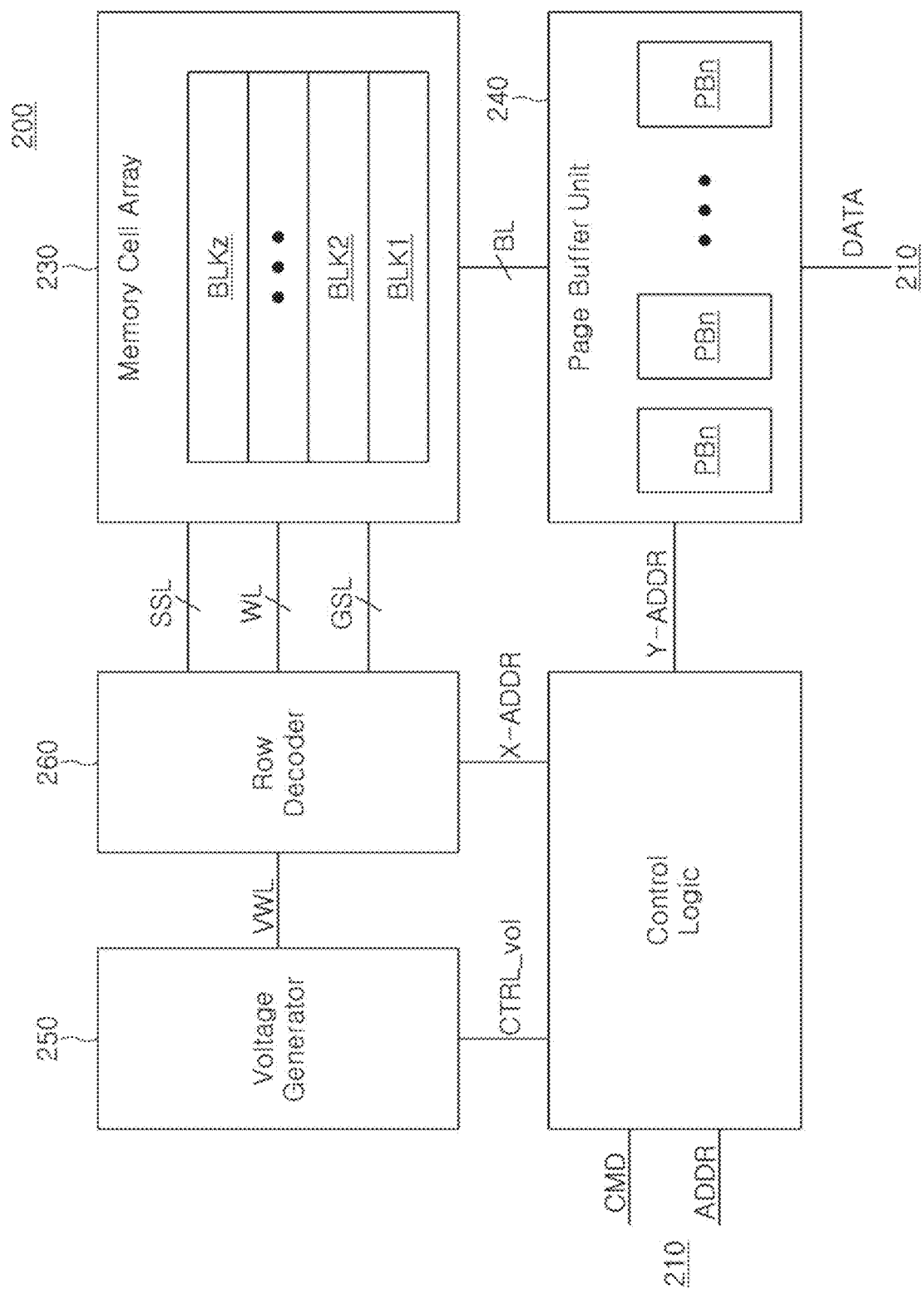
FIG. 3 is a block view illustrating a memory device according to at least one example embodiment of the present disclosure.

FIG. 3 is a block view illustrating a memory device according to at least one example embodiment.

Referring to FIG. 3, a memory device 200 may include a control logic circuit 220, a memory cell array 230, a page buffer portion 240, a voltage generator 250, and a row decoder 260. The memory device 200 may further include a memory interface circuit 210 for inputting and outputting signals and data necessary for operations, and further may include a column logic, a pre-decoder, a temperature sensor, a command decoder, an address decoder, or the like. According to at least some example embodiments, the memory device 200 may include circuitry configured, via hardware and/or software (e.g., firmware), to perform and/or control any operation described in the specification as being performed by the memory device 200 or an element thereof (e.g., memory interface circuit 210, control logic circuit 220, memory cell array 230, page buffer portion 240, voltage generator 250, and row decoder 260).

The control logic circuit 220 may control various operations in the memory device 200. The control logic circuit 220 may output various control signals in response to a command CMD and/or an address ADDR from the memory interface circuit 210. For example, the control logic circuit 220 may output a voltage control signal CTRL_vol, a row address X-ADDR, and a column address Y-ADDR.

The memory cell array 230 may include a plurality of memory blocks BLK1 to BLKz (z is a positive integer), and each of the plurality of memory blocks BLK1 to BLKz may include a plurality of memory cells. The memory cell array 230 may be connected to the page buffer portion 240 through bit lines BL, and may be connected to the row decoder 260 through word lines WL, string select lines SSL, and ground select lines GSL.

In at least one example embodiment, the memory cell array 230 may include a three-dimensional (3D) memory cell array, and the 3D memory cell array may include a plurality of NAND strings. Each NAND string may include memory cells connected to word lines vertically stacked on a substrate. U.S. Laid-Open Pat. Publication Nos. 7,679,133, 8,553,466, 8,654,587, 8,559,235, and U.S. Laid-Open Patent Publication No. 2011/0233648 are combined herein by reference. In at least one example embodiment, the memory cell array 230 may include a two dimensional (2D) memory cell array, and the 2D memory cell array may include a plurality of NAND strings disposed in row and column directions.

The page buffer portion 240 may include a plurality of page buffers PB1 to PBn (n is an integer of 3 or greater), and the plurality of page buffers PB1 to PBn may be connected to the memory cells through the plurality of bit lines BL, respectively. The page buffer portion 240 may select at least one bit line from among the bit lines BL in response to the column address Y-ADDR. The page buffer portion 240 may operate as a write driver or a sense amplifier depending on an operating mode. For example, in a program operation, the page buffer portion 240 may apply a bit line voltage corresponding to data to be programmed to a selected bit line. In a read operation, the page buffer portion 240 may sense data stored in the memory cell by sensing a current or voltage of a selected bit line.

The voltage generator 250 may generate various types of voltages for performing a program operation, a read operation, and an erase operation based on the voltage control signal CTRL_vol. For example, the voltage generator 250 may generate a program voltage, a read voltage, a program verify voltage, an erase voltage, and the like, as a word line voltage VWL.

The row decoder 260 may select one of the plurality of word lines WL in response to the row address X-ADDR and may select one of the plurality of string select lines SSL. For example, in a program operation, the row decoder 260 may apply a program voltage and a program verify voltage to the selected word line, and in a read operation, the row decoder 260 may apply a read voltage to the selected word line.

Figure 4:
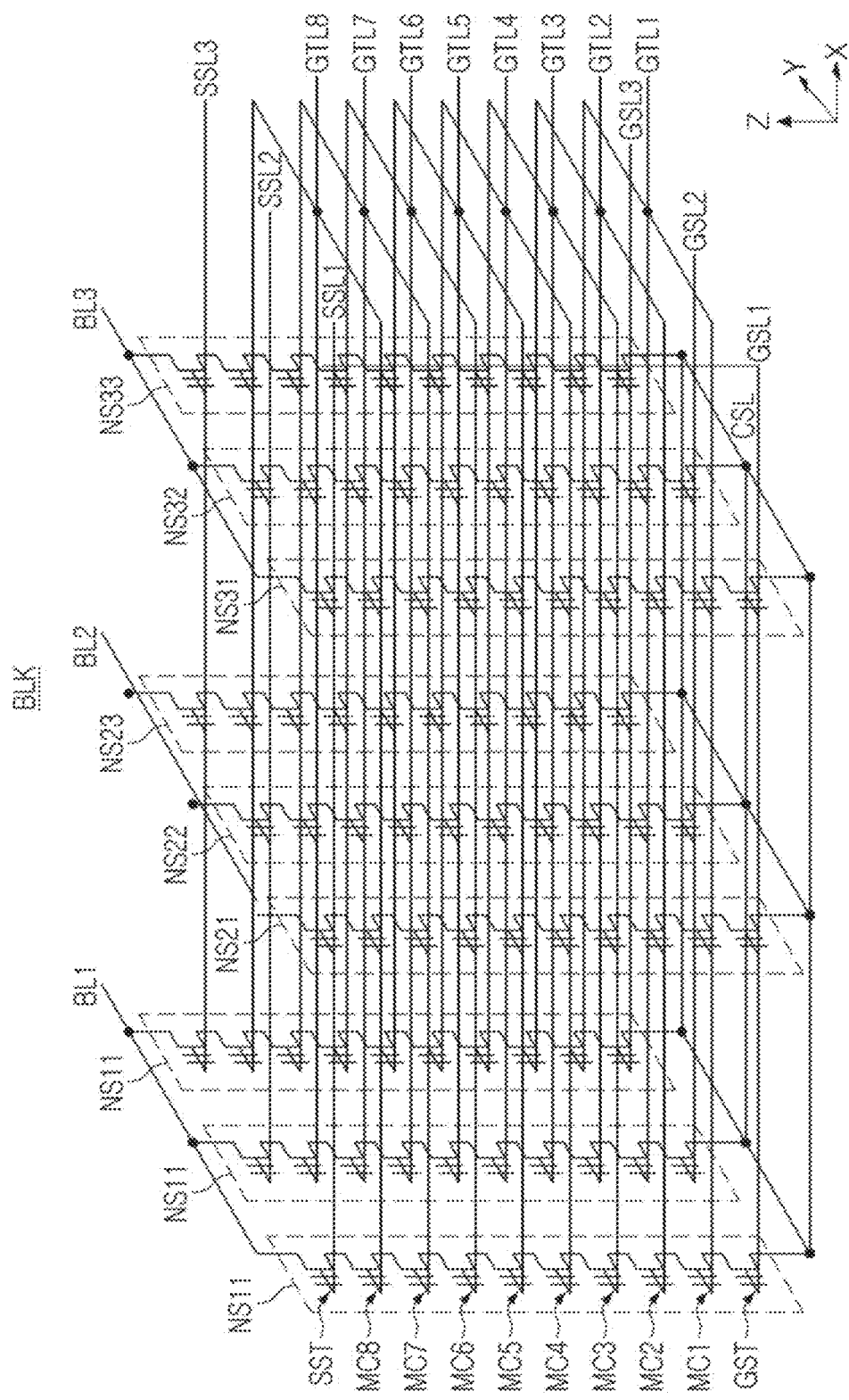
FIG. 4 is a circuit view illustrating a memory cell array of a memory device according to at least one example embodiment of the present disclosure.

FIG. 4 is a circuit view illustrating a memory cell array of a memory device according to at least one example embodiment.

Figure 8:
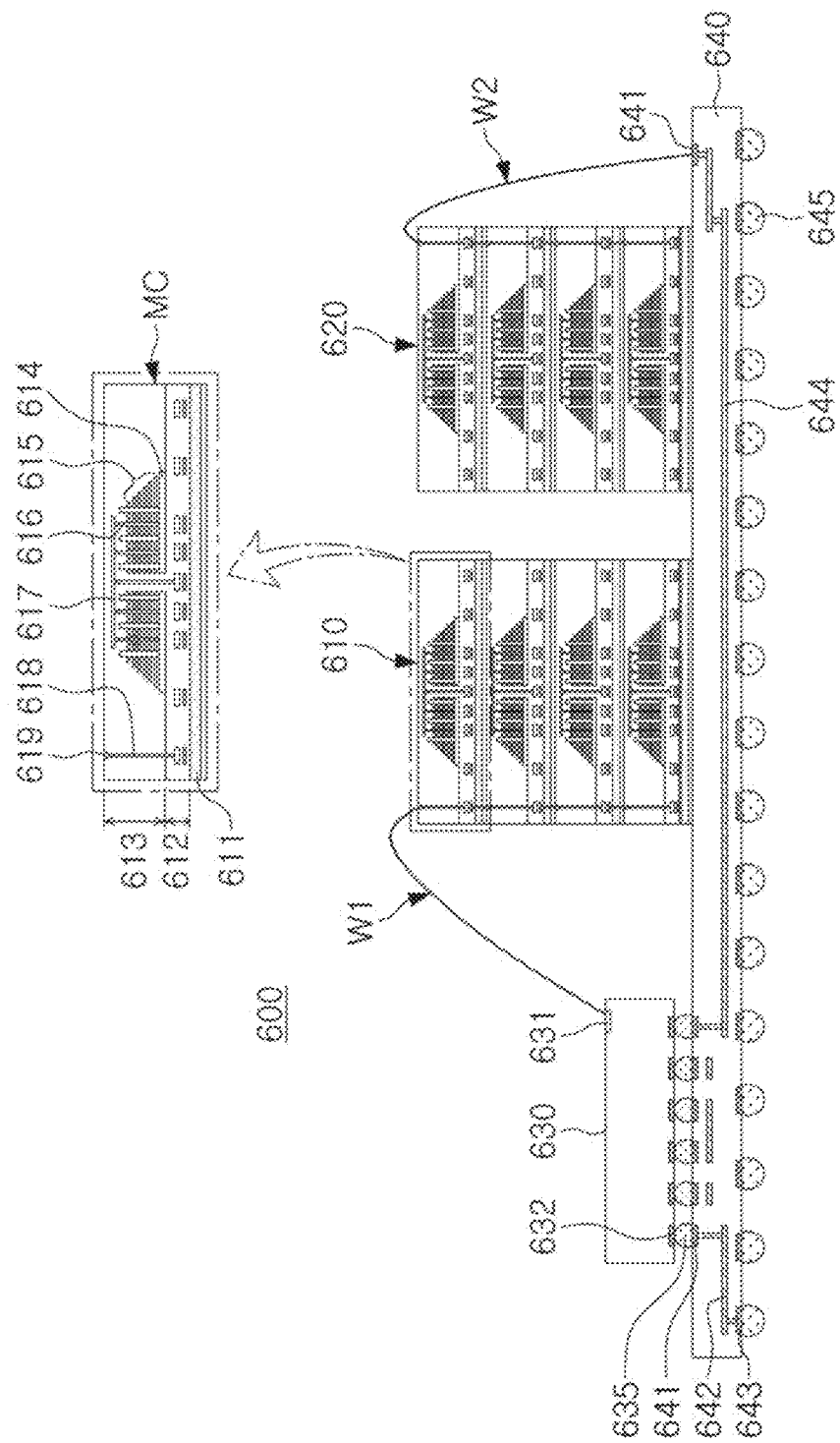

FIG. 4 is a view illustrating a 3D V-NAND structure applicable to a memory package according to at least one example embodiment. When the memory devices included in the memory package are implemented as a 3D V-NAND type flash memory, each of a plurality of memory blocks included in the memory devices may be represented by an equivalent circuit as illustrated in FIG. 8.

A memory block BLK illustrated in FIG. 4 may represent a three-dimensional memory block formed on a substrate in a three-dimensional structure. For example, a plurality of memory NAND strings included in the memory block BLK may be formed in a direction perpendicular to the substrate.

Referring to FIG. 4, the memory block BLK may include a plurality of memory NAND strings NS11 to NS33 connected between the bit lines BL1, BL2, and BL3 and the common source line CSL. Each of the plurality of memory NAND strings NS11 to NS33 may include a string select transistor SST, a plurality of memory cells MC1, MC2, . . . , MC8, and a ground select transistor GST. FIG. 4 illustrates the example in which each of the plurality of memory NAND strings NS11 to NS33 may include eight memory cells MC1, MC2, . . . , MC8, but example embodiments are not limited thereto.

The string select transistor SST may be connected to corresponding string select lines SSL1, SSL2, and SSL3, respectively. The plurality of memory cells MC1, MC2, . . . , MC8 may be connected to corresponding gate lines GTL1, GTL2, . . . , GTL8, respectively. The gate lines GTL1, GTL2, . . . , GTL8 may be word lines, and a portion of the gate lines GTL1, GTL2, . . . , GTL8 may be dummy word lines. The ground select transistor GST may be connected to corresponding ground select lines GSL1, GSL2, and GSL3. The string select transistor SST may be connected to corresponding bit lines BL1, BL2, and BL3, and the ground select transistor GST may be connected to a common source line CSL.

Word lines (e.g., WL1) having the same height may be connected in common, and ground select lines GSL1, GSL2, and GSL3 and string select lines SSL1, SSL2, and SSL3 may be isolated from each other. FIG. 4 illustrates the example in which the memory block BLK may be connected to eight gate lines GTL1, GTL2, . . . , GTL8 and three bit lines BL1, BL2, and BL3, but example embodiments are not limited thereto.

Figure 5:
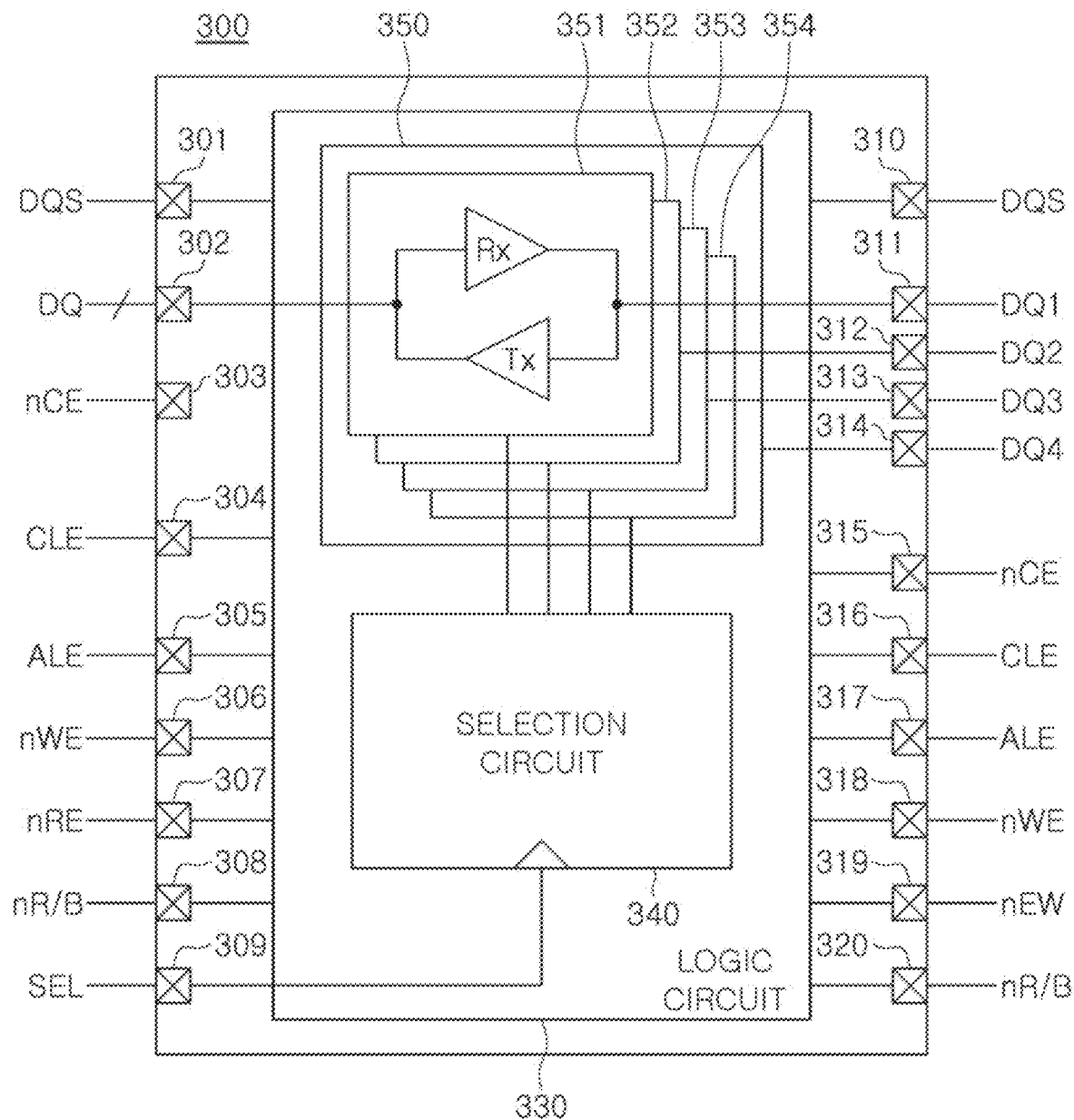
FIG. 5 is a view illustrating a buffer chip included in a memory package according to at least one example embodiment of the present disclosure.

FIG. 5 is a view illustrating a buffer chip included in a memory package according to at least one example embodiment.

Referring to FIG. 5, a buffer chip 300 according to at least one example embodiment may include a plurality of chip pads 301 to 320. A portion of the plurality of chip pads 301 to 320 may be connected to an external device controller present externally of the memory package, and the other portion thereof may be connected to a plurality of memory chips included in the memory package along with the buffer chip 300.

The buffer chip 300 may transmit to and receive from the device controller a data strobe signal (DQS), a data signal (DQ), a chip enable signal (nCE), a command latch enable signal (CLE), an address latch enable signal (ALE), a write enable signal (nWE), a read enable signal (nRE), a ready busy signal (nR/B), and a select signal (SEL) through a portion of the chip pads 301 to 309 connected to the device controller. A plurality of the chip pads 302 for transmitting and receiving the data signals DQ may be provided. Commands, addresses, and data for controlling the memory chips may be transmitted through the data signal DQ.

Also, the buffer chip 300 may transmit to and receive from the memory chips a data strobe signal (DQS), a data signal (DQ), a chip enable signal (nCE), a command latch enable signal (CLE), an address latch enable signal (ALE), a write enable signal (nWE), a read enable signal (nRE), and a ready busy signal (nR/B) through a portion of the chip pads 301 to 309 connected to the memory chips included in the memory package. In at least one example embodiment, the buffer chip 300 may be connected to the memory chips divided into four groups, and may output the data signal DQ received from the device controller to at least one of the data signals DQ1 to DQ4 corresponding to the first to fourth groups, or may output at least one of the data signals DQ1 to DQ4 received from the memory chips to the device controller as the data signal DQ. In other words, in the example embodiment illustrated in FIG. 5, the buffer chip 300 may be connected to the memory chips divided into four groups through four channels. However, the number of the channels connecting the buffer chip 300 to the memory chips may be varied in example embodiments.

Referring to FIG. 5, the buffer chip 300 may include a logic circuit 330 configured to transfer signals and/or data received from an external device controller to the memory chips disposed in the memory package. The logic circuit 330 may provide a signal and data transmission path between the plurality of chip pads 301 to 320. For example, the number of device controllers connected to the buffer chip 300 may be different from the number of memory chips, and the number of memory chips may be greater than the number of device controllers. Accordingly, the buffer chip 300 may activate a portion of the chip pads 310 to 320 connected to the memory chips to transmit signals and/or data in response to a control command from the device controller.

Referring to FIG. 5, the logic circuit 330 may include a selection circuit 340 and a transmission circuit 350. The transmission circuit 350 may include a plurality of unit transmission circuits 351 to 354 corresponding to channels connecting the memory chips to the buffer chip 300. For example, the plurality of unit transmission circuits 351 to 354 may be connected to the chip pads 311 to 314 for transmitting the first to fourth data signals DQ1 to DQ4 through first to fourth channels. Each of the plurality of unit transmission circuits 351 to 354 may include a transmitter Tx and a receiver Rx. The transmitter Tx may be or include, for example, a transmitter circuit structured to transmit signals in accordance with known methods. The receiver Rx may be or include, for example, a receiver circuit structured to receive signals in accordance with known methods.

The selection circuit 340 may select and activate at least one of the plurality of unit transmission circuits 351 to 354 in response to a selection signal SEL received from the device controller, and may deactivate the others. When the memory package including the buffer chip 300 supports a multi-channel operation, two or more of the plurality of unit transmission circuits 351 to 354 may be simultaneously activated.

As an example, when the device controller intends to store data in memory chips connected to the buffer chip 300 through a first channel, the selection circuit 340 may activate a first unit transmission circuit 351 according to the selection signal SEL, and may deactivate the other unit transmission circuits 352 to 354. In the first unit transmission circuit 351, the transmitter Tx may be activated, and the data signal DQ received from the device controller may be transmitted to the memory chips of the first group through the chip pad 311 as the first data signal DQ1.

In at least one example embodiment, when data to be read from the memory package by the device controller is stored in memory chips connected to the buffer chip 300 through a fourth channel, the selection circuit 340 may activate the fourth unit transmission circuit 354 according to the selection signal SEL, and may deactivate the other unit transmission circuits 351 to 353. In the fourth unit transmission circuit 354, the receiver Rx may be activated and may receive the fourth data signal DQ4 from the memory chips of the fourth group, and the fourth data signal DQ4 may be output to the device controller as the signal DQ through the chip pad 302.

As described above, the buffer chip 300 according to at least one example embodiment may function as a 1:N multiplexer/demultiplexer between the device controller and the memory chips. Also, the buffer chip 300 may provide a signal branch between a single device controller and memory chips divided into three or more groups. Accordingly, the number of memory chips connected to a single device controller and the number of channels for controlling the memory chips may be increased to a single buffer chip 300, and a storage space of the memory package and the storage device including the memory package may be efficiently increased and managed.

In at least one example embodiment, at least a portion of the memory chips connected to the buffer chip 300 may be included in different memory packages. As an example, the memory chips connected to the buffer chip 300 through first and second channels may be included in a first memory package along with the buffer chip 300, and memory chips connected to the buffer chip 300 through the third and fourth channels may be included in a second memory package separate from the first memory package. As an example, the memory chips of the second memory package may be connected to the buffer chip 300 through a redistribution layer disposed in the system substrate on which the first memory package and the second memory package are mounted. The redistribution layer in the system substrate may be implemented as wirings providing various signal paths. By connecting a single buffer chip 300 capable of 1:N signal branching between the device controller and the memory chips, flexibility in design of the memory package may improve.

Also, the buffer chip 300 according to at least one example embodiment may include a plurality of unit transmission circuits 351 to 354 for transmitting and receiving signals corresponding to the plurality of channels. Each of the plurality of unit transmission circuits 351 to 354 may be connected to memory chips through a single channel, and a load of each of the plurality of unit transmission circuits 351 to 354 may decrease as compared to the example in which the method of connecting a signal transmission circuit to the memory chips through two or more channels is used. Therefore, a high-speed signal operation using a high-frequency signal may be implemented through the buffer chip 300.

FIGS. 6 to 9 are views illustrating a memory package according to at least one example embodiment.

Figure 6:
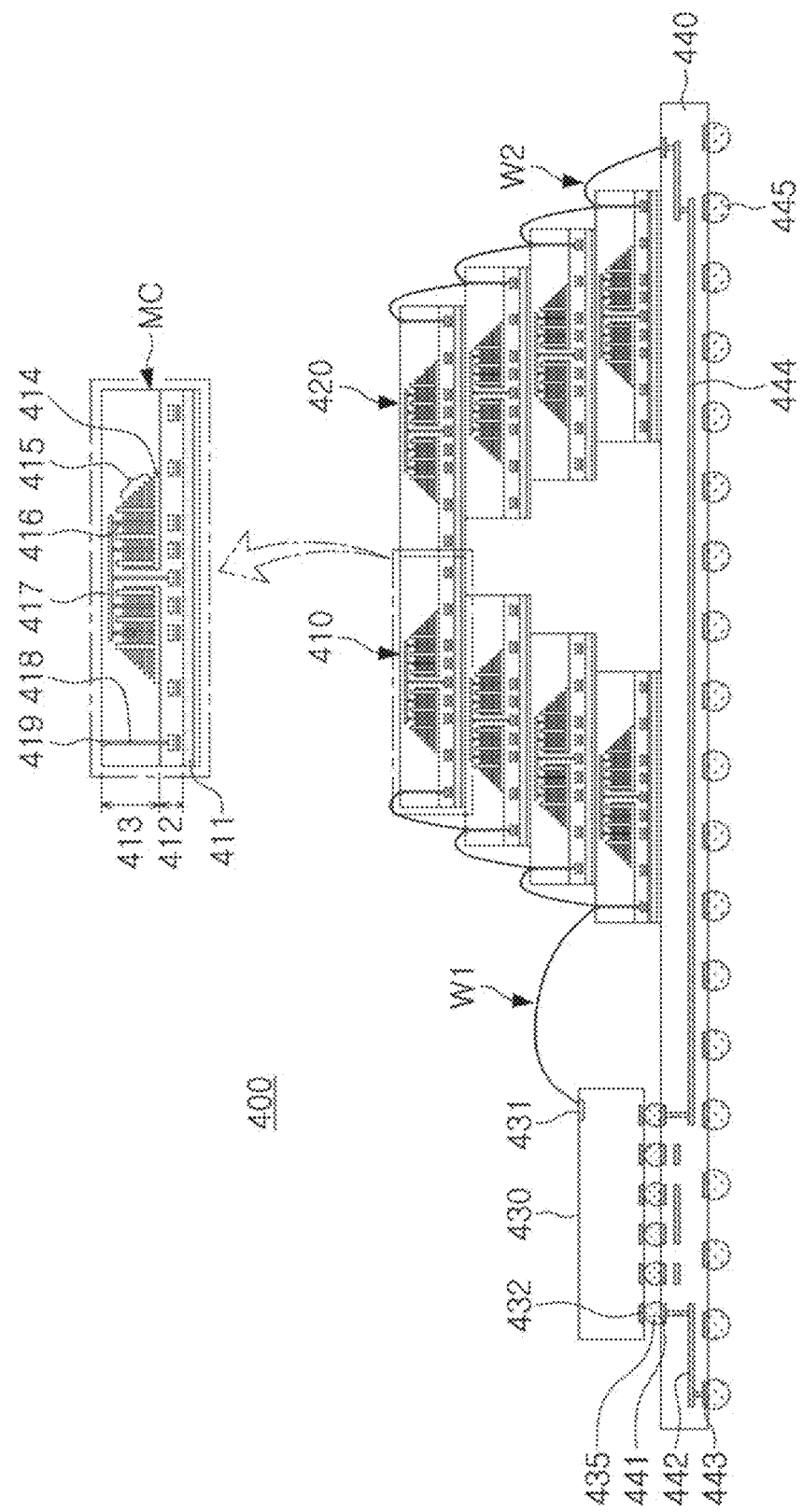
FIGS. 6 to 9 are views illustrating a memory package according to at least one example embodiment of the present disclosure.

Referring to FIG. 6, a memory package 400 according to at least one example embodiment may include a plurality of memory chips MC, a buffer chip 430, and a package substrate 440. The plurality of memory chips MC may be divided into a first group 410 and a second group 420, and the memory chips MC of the first group 410 and the memory chips MC of the second group 420 may be disposed in different positions in a direction parallel to an upper surface of the package substrate 440. In each of the first group 410 and the second group 420, the memory chips MC may form stepped differences and may be stacked in a staircase shape.

Each of the memory chips MC may include a semiconductor substrate 411 and a first structure 412 and a second structure 413 stacked on the semiconductor substrate 411. For example, the first structure 412 may include a peripheral circuit area in which peripheral circuits required for operation of each of the memory chips MC, such as a row decoder, a page buffer, and a voltage generator are disposed, for example. The second structure 413 may include a cell area in which a common source line 414, a gate stack structure 415 having gate electrode layers stacked on the common source line 414, channel structures 416 penetrating the gate stack structure 415, channel structures 416 penetrating the gate stack structure 415, and bit lines 417 electrically connected to the channel structures 416 are disposed.

Each of the memory chips MC may include a through wiring 418 connected to peripheral circuits in the first structure 412 and extending from the second structure 413. The through wiring 418 may be connected to an input and output pad 2210 disposed on each of the memory chips MC. An input and output pad 419 of each of the memory chips MC included in the first group 410 may be connected to the first wire W1, and an input and output pad 419 of each of the memory chips MC included in the second group 420 may be connected to the second wire W2. Accordingly, the memory chips MC included in the first group 410 and the second group 420 may be electrically connected to each other.

Referring to FIG. 6 illustrating a cross-sectional view, a single through wiring 418 may be provided in each of the memory chips MC, but each of the memory chips MC may include a plurality of through wirings. The plurality of through wirings may be connected to the plurality of first wires through the plurality of input and output pads.

The plurality of memory chips MC and the buffer chip 430 may be mounted on the package substrate 440. The package substrate 440 may include a plurality of bonding pads 441 and 443 and redistribution layers 442 and 444 providing a plurality of signal paths. The redistribution layers 442 and 444 may provide signal paths between an external device controller and the buffer chip 430 and/or signal paths between the buffer chip 430 and the memory chips MC. At least a portion of the redistribution layers 442 and 444 may include chip bumps 435 connecting the buffer chip 430 to the package substrate 440 through the bonding pads 441 and 443 and/or the package bumps 445 disposed below the package substrate 440.

A portion of the redistribution layers 442 and 444 may provide a signal path which may connect the upper bonding pad 441 to the lower bonding pad 441 and through which an external device controller and the buffer chip 430 may exchange signals through the lower bumps 445 disposed below the package substrate 440. A portion of the redistribution layers 444 may provide a signal path which may connect the second wire W2 to the upper bonding pad 441, and through which the memory chips MC of the second group 420 and the buffer chip 430 may exchange signals. In other words, a portion of the redistribution layers 444 may provide a signal path between the second wire W2 and the lower chip pad 432 of the buffer chip 430.

Referring to FIG. 6, the memory chips MC of the first group 410 may be connected to the buffer chip 430 by the first wire W1. As an example, the buffer chip 430 may include a plurality of chip pads 431 and 432, and the first chip pad 431 may be connected to the first wire W1. The first chip pad 431 may be an upper chip pad formed on an upper surface of the buffer chip 430 so as to be connected to the first wire W1. In at least one example embodiment, the buffer chip 430 and the memory chips MC of the first group 410 may be connected to each other through the plurality of first wires W1, and each of the first chip pads 431 and the memory chips MC may include a plurality of input and output pads 419.

Differently from the first group 410, the memory chips MC of the second group 420 may be connected to the second chip pad 432 of the buffer chip 430 through the second wire W2 and a signal path provided by a portion of the redistribution layers 442 and 444. Differently from the first chip pad 431, the second chip pad 432 may be a lower chip pad formed on a lower surface of the buffer chip 430, and may be connected to the upper bonding pad 441 of the package substrate 440 through the chip bump 435.

In other words, in the example embodiment illustrated in FIG. 6, the memory chips MC of the first group 410 may be directly connected to the buffer chip 430 through the first wire W1, and the memory chips MC of the second group 420 may be connected to the buffer chip 430 through the second wire W2 and at least a portion of the signal paths provided by the redistribution layers 442 and 444 disposed in the package substrate 440. Accordingly, the number and the arrangement of the memory chips MC connected to a single buffer chip 430 in the memory package 400, and the number of groups 410 and 420 dividing the memory chips MC may be designed with flexibility.

In at least one example embodiment, the groups 410 and 420 dividing the memory chips MC may correspond to channels required for the device controller to control the memory package 400. In the example embodiment illustrated in FIG. 6, the device controller may divide the memory chips MC into a first channel and a second channel when controlling the memory chips MC. In at least one example embodiment, by applying the buffer chip 430 capable of 1:N signal branching to the memory package 400, the number of channels for dividing the memory chips MC may be sufficiently secured by only a single buffer chip 430.

Figure 7:
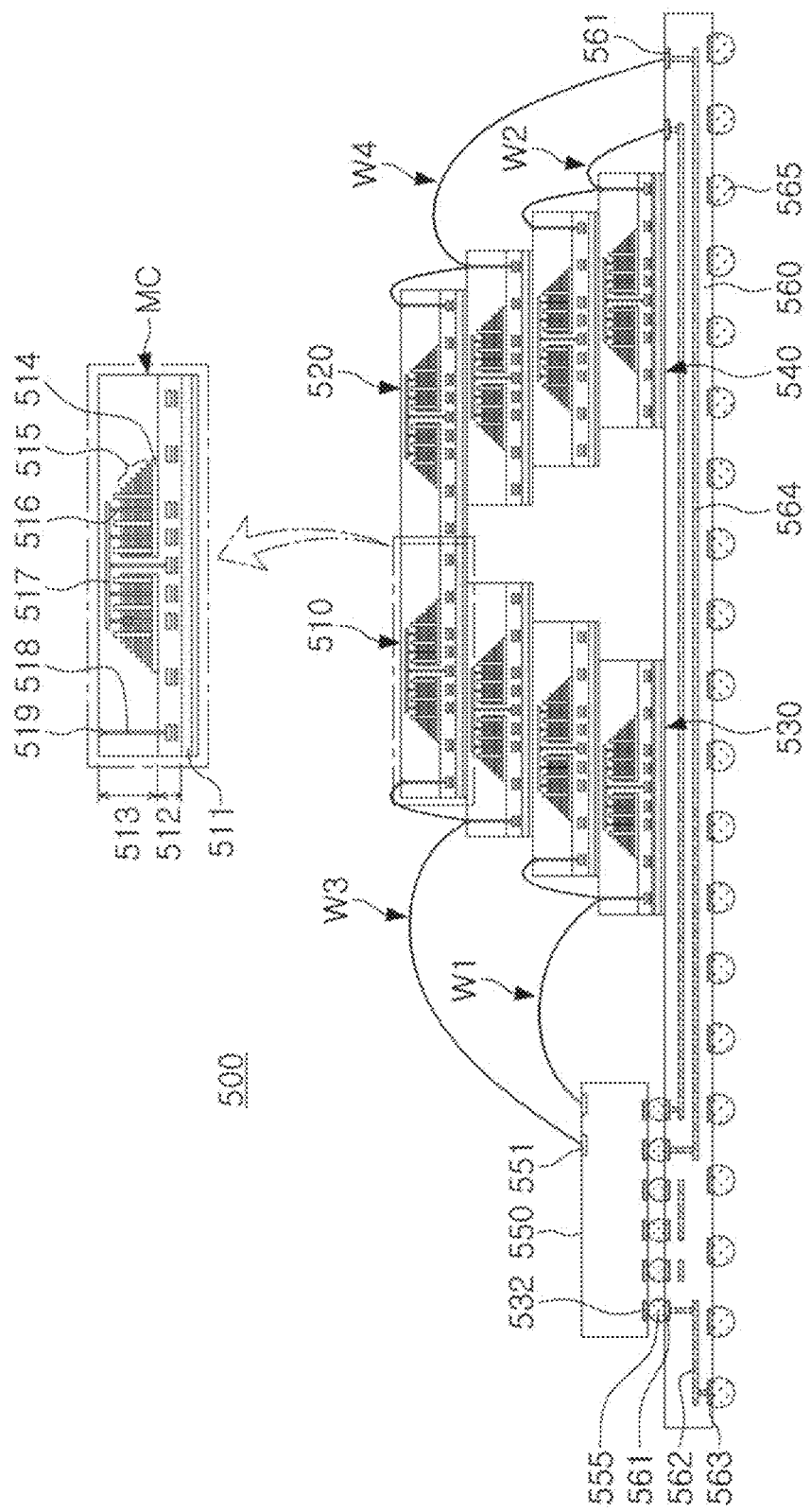

Referring to FIG. 7, a memory package 500 according to at least one example embodiment may include a plurality of memory chips MC, a buffer chip 550, and a package substrate 560. The plurality of memory chips MC may be divided into first to fourth groups 510 to 540, and the memory chips MC may form a stepped difference therebetween and may be stacked in a staircase shape in each of the first to fourth groups 510 to 540. In the example embodiment illustrated in FIG. 7, the memory chips MC of the first and third groups 510 and 530 may be alternately stacked, and the memory chips MC of the second and fourth groups 520 and 540 may be alternately stacked. Accordingly, the memory chips of each of the first and second groups 510 and 520 may be disposed at the same level in a direction perpendicular to an upper surface of the package substrate 560.

Each of the memory chips MC may have a structure similar to the aforementioned example described with reference to FIG. 6. Each of the memory chips MC may include a semiconductor substrate 511 and a first structure 512 and a second structure 513 stacked on the semiconductor substrate 511. For example, the first structure 512 may include a peripheral circuit area in which peripheral circuits required for operation of each of the memory chips MC, such as a row decoder, a page buffer, and a voltage generator are disposed, for example. The second structure 513 may include a cell area in which a common source line 514, a gate stack structure 515 having gate electrode layers stacked on the common source line 514, channel structures 516 penetrating the gate stack structure 515, channel structures 516 penetrating the gate stack structure 515, and bit lines 517 electrically connected to the channel structures 516 are disposed. Each of the memory chips MC may include a through wiring 518 connected to peripheral circuits in the first structure 512 and extending from the second structure 513.

For example, each of the memory chips MC may include an input and output pad 519 connected to one of the wires W1 to W4. The memory chips MC of the first group 510 may be directly connected to the first chip pads 551 of the buffer chip 550 through the first wire W1, and the memory chips MC of the third group 530 may be directly connected to the first chip pads 551 of the buffer chip 550 through the third wire W3. The first wire W1 and the third wire W3 may be connected to different chip pads among the first chip pads 551. The configuration in which the memory chips MC may be directly connected to the buffer chip 550 through the first wire W1 or the third wire W3 may indicate that the memory chips MC may not use a different structure other than the first wire W1 or the third wire W3 for signal transmission.

The memory chips MC of the second group 520 may be connected to the second wire W2, and the memory chips MC of the fourth group 540 may be connected to the fourth wire W4. The second wire W2 and the fourth wire W4 may be connected to a portion of the redistribution layers 562 and 564 disposed in the package substrate 560 through the upper bonding pad 561 formed on an upper surface of the package substrate 560. In other words, the memory chips MC of the second group 520 and the fourth group 540 may be connected to the buffer chip 550 through a signal path provided by a portion of the redistribution layers 562 and 564 disposed in the package substrate 560 in addition to the second and fourth wires W2 and W4. Each of the first to fourth wires W1 to W4 may include a plurality of wires.

As described in the aforementioned example embodiment with reference to FIG. 6, the redistribution layers 562 and 564 may be connected to at least one of the upper bonding pad 561 and the lower bonding pad 563. Also, a portion of the redistribution layers 564 connected to the second and fourth wires W2 and W4 may be connected to the second chip pads 552 of the buffer chip 550 through the chip bump 555. Accordingly, the memory chips MC of the second group 520 and the fourth group 540 may exchange signals with the buffer chip 550 through the second and fourth wires W2 and W4 and a portion of the redistribution layers 562 and 564.

In the example embodiment illustrated in FIG. 7, the memory chips MC may be divided into four groups 510 to 540, and the buffer chip 550 may provide four channels such that the memory chips MC may be divided into the fourth groups 510 to 540. In other words, the buffer chip 550 may branch a signal in 1:4 to mediate a signal between a single device controller and the memory chips MC included in the memory package 500. For example, a signal received from the device controller may be transmitted to at least one selected channel of the four channels, or may transmit a signal received from at least one of the four channels to the device controller. The number of channels included in the memory package 500 may be varied depending on an increase in the number of the memory chips MC or a method of grouping the memory chips MC.

Referring to FIG. 8, a memory package 600 according to at least one example embodiment may include a plurality of memory chips MC, a buffer chip 630, and a package substrate 640. The plurality of memory chips MC may be divided into first and second groups 610 and 620, and memory chips MC may be alternately stacked in each of the first and second groups 610 and 620.

A structure of each of the memory chips MC may be similar to the aforementioned example described with reference to FIGS. 6 and 7. Each of the memory chips MC may include a semiconductor substrate 611 and a first structure 612 and a second structure 613 stacked on the semiconductor substrate 611. For example, the first structure 612 may include a peripheral circuit area in which peripheral circuits required for operation of each of the memory chips MC, such as a row decoder, a page buffer, and a voltage generator are disposed, for example. The second structure 613 may include a cell area in which a common source line 614, a gate stack structure 615 having gate electrode layers stacked on the common source line 614, channel structures 616 penetrating the gate stack structure 615, channel structures 616 penetrating the gate stack structure 615, and bit lines 617 electrically connected to the channel structures 616 are disposed. Each of the memory chips MC may include a through wiring 618 connected to peripheral circuits in the first structure 612 and extending from the second structure 613.

However, in the example embodiment illustrated in FIG. 8, the memory chips MC may be alternately stacked without a stepped difference in each of the first and second groups 610 and 620. Accordingly, the memory chips MC may be connected to each other by the through wiring 618 instead of the first wire W1 or the second wire W2. In the example embodiment illustrated in FIG. 8, the through wiring 618 may be a through silicon via (TSV) for connecting the stacked memory chips MC, differently from the through wirings 418 and 518 illustrated in the examples in FIGS. 6 and 7.

A method of connecting the memory chips MC of each of the first and second groups 610 and 620 to the buffer chip 630 may be similar to the example described with reference to FIG. 6. The memory chips MC of the first group 610 may be directly connected to the buffer chip 630 through the first wire W1. For example, the first wire W1 may be connected to the first chip pad 631 formed on an upper surface of the buffer chip 630. The memory chips MC of the second group 620 may be connected to the buffer chip 630 through the second wire W2 and a signal path provided by a portion of the redistribution layers 662 and 664 formed in the package substrate 660. As an example, the memory chips MC of the second group 620 may be connected to the second chip pad 632 formed on the lower surface of the buffer chip 630 through a signal path provided by a portion of the redistribution layers 662 and 664.

Figure 9:
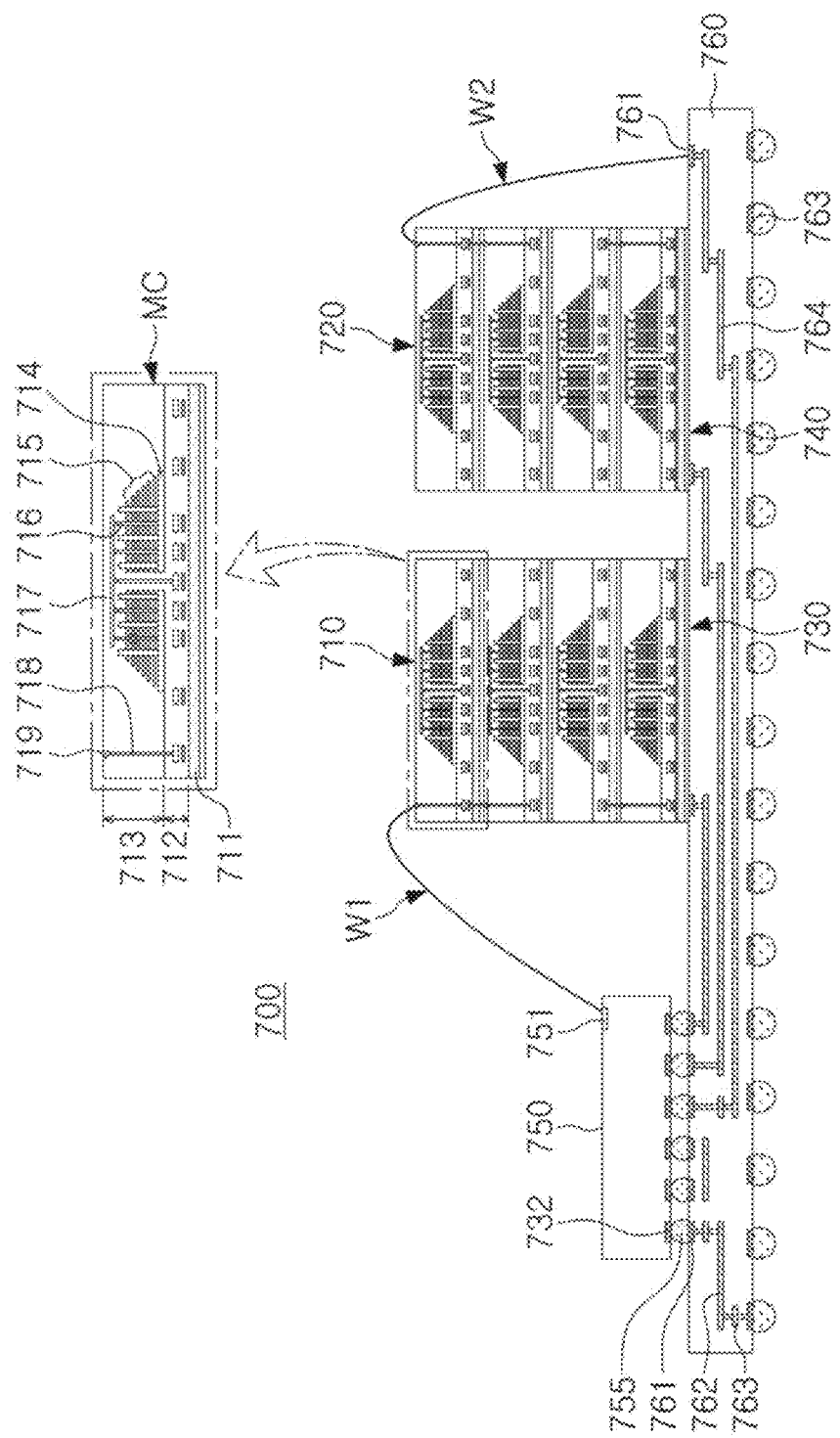

Referring to FIG. 9, a memory package 700 according to at least one example embodiment may include a plurality of memory chips MC, a buffer chip 750, and a package substrate 760. The plurality of memory chips MC may be divided into first to fourth groups 710 to 740, and memory chips MC may be alternately stacked in each of the first to fourth groups 710 to 740. For example, the memory chips MC of the first and third groups 710 and 730 may be alternately stacked, and the memory chips MC of the second and fourth groups 720 and 740 may be alternately stacked.

Each of the memory chips MC may include a semiconductor substrate 711 and a first structure 712 and a second structure 713 stacked on the semiconductor substrate 711. For example, the first structure 712 may include a peripheral circuit area in which peripheral circuits required for operation of each of the memory chips MC, such as a row decoder, a page buffer, and a voltage generator are disposed, for example. The second structure 713 may include a cell area in which a common source line 714, a gate stack structure 715 having gate electrode layers stacked on the common source line 714, channel structures 716 penetrating the gate stack structure 715, channel structures 716 penetrating the gate stack structure 715, and bit lines 717 electrically connected to the channel structures 716 are disposed. Each of the memory chips MC may include a through wiring 718 connected to peripheral circuits in the first structure 712 and extending from the second structure 713.

The memory chips MC disposed in a relatively upper portion in a direction perpendicular to an upper surface of the package substrate 760, the memory chips MC of the first and second groups 710 and 720, for example, may be connected to the buffer chip 750 through wires W1 and W2. For example, the memory chips MC of the first group 710 may be directly connected to the buffer chip 750 through the first wire W1, and the memory chips MC of the second group 720 may be connected to the buffer chip 750 through the second wire W2 and a signal path provided by at least a portion of the redistribution layers 762 and 764 disposed in the package substrate 760.

The memory chips MC disposed relatively in a lower portion in a direction perpendicular to the upper surface of the package substrate 760, the memory chips MC of the third and fourth groups 730 and 740, for example, may be connected to the buffer chip 750 without using the wires W1 and W2. For example, the memory chips MC of each of the third and fourth groups 730 and 740 may be connected to the buffer chip 750 through a signal path provided by at least a portion of the redistribution layers 762 and 764 without using a wire. In some example embodiments, in consideration of the arrangement of the redistribution layers 762 and 764 providing a signal path, the upper bonding pad 761 connected to the second wire W2 and the upper bonding pad 761 connected to the memory chips MC of the fourth group 740 may be isolated from each other in one direction parallel to the upper surface of the package substrate 760.

The structure of the memory chips MC may be similar to the aforementioned example embodiments described with reference to FIGS. 6 to 9. However, the structures of the memory chips MC included in the first and second groups 710 and 720 and the memory chips MC included in the third and fourth groups 730 and 740 may be different from each other. For example, the memory chips MC of the first and second groups 710 and 720 disposed in a relatively upper portion may be connected to an input and output pad 719 disposed above the memory chips MC through the through wiring 718. The memory chips MC of the third and fourth groups 730 and 740 may be connected to the input and output pad 719 formed below the memory chips MC through the through wiring 718.

Figure 10:
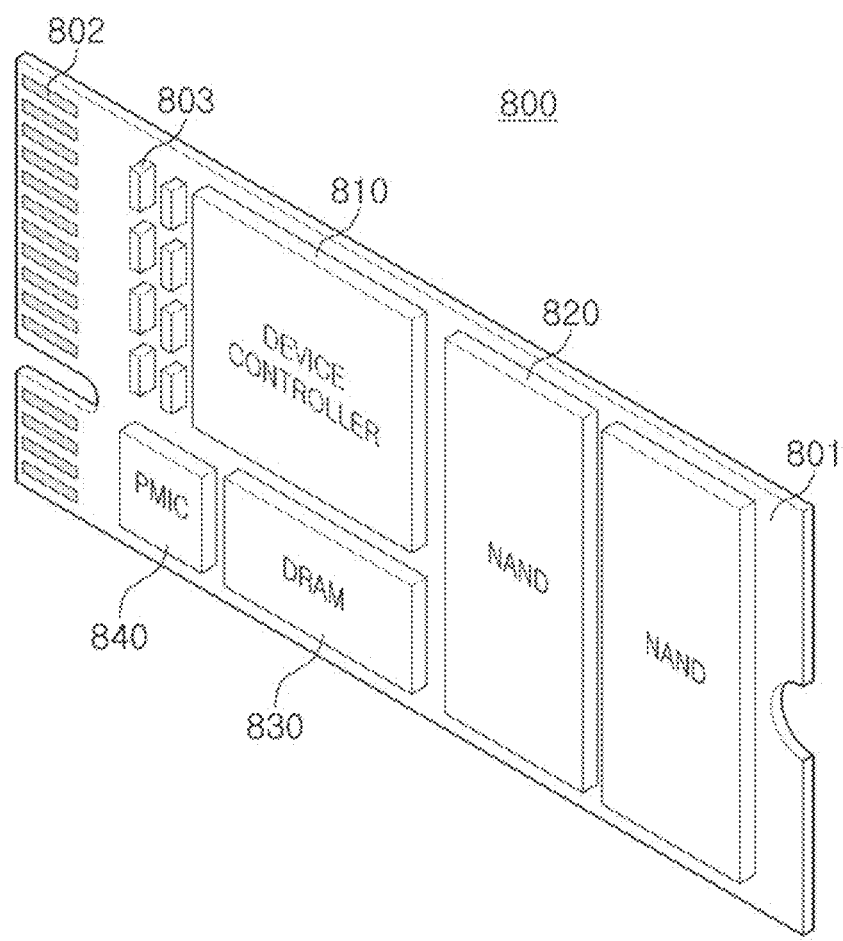
FIG. 10 is a view illustrating an exterior of a storage device according to at least one example embodiment of the present disclosure.

FIG. 10 is a view illustrating an exterior of a storage device according to at least one example embodiment.

A storage device 800 illustrated in FIG. 10 according to the example embodiment may be implemented by a solid state drive (SSD). The storage device 800 may have a form factor according to the M.2 standard, and may communicate with an external central processing unit, a system-on-chip, an application processor, and the like, according to a peripheral component interconnect express (PCIe) protocol. The form factor of the storage device 800 and a protocol for communicating with other external devices may be varied in example embodiments. For example, the storage device 800 may have a form factor such as a 2.5-inch disk drive, and may communicate with other external devices according to a serial advanced technology attachment (SATA) protocol.

The storage device 800 may include a system substrate 801, connector pins 802 and component elements 803 formed on the system substrate 801, a device controller 810 mounted on the system substrate 801, memory packages 820, a DRAM 830, and a PMIC 840. The connector pins 802 may be in contact with a computer device on which the storage device 800 is mounted and/or pins of a server device. The component elements 803 may include passive elements such as a resistor and a capacitor required for operation of the storage device 800.

The device controller 810 may control the storage device 800 according to a control command from a computer device and/or a server device. The device controller 810 may store data received through the connector pins 802 in the memory packages 820 and/or the DRAM 830, or may read data stored in the memory packages 820 and/or the DRAM 1030 and may output the data to a computer device and/or a server device. The PMIC 840 may distribute power supplied through the connector pins 802 to the device controller 810, the memory packages 820, and the DRAM 830.

Each of the memory packages 820 may be implemented as the memory packages described in the aforementioned example embodiments. For example, at least one of the memory packages 820 may include a buffer chip and a plurality of memory chips. In example embodiments, only one of the memory packages 820 may include a buffer chip, and the other memory packages may only include memory chips. In some example embodiments, the memory chips included in different memory packages 820 may share a buffer chip included in one of the memory packages 820.

For the memory chips included in different memory packages 820 to share a buffer chip included in one of the memory packages 820, wirings for connecting the memory chips included in different memory packages 820 may be necessary. In at least one example embodiment, a portion of the wirings formed in the system substrate 801 may be used as a redistribution layer for connecting the memory chips included in different memory packages 820. In the description below, the configuration will be described in greater detail with reference to FIGS. 11 and 12.

Figure 11:
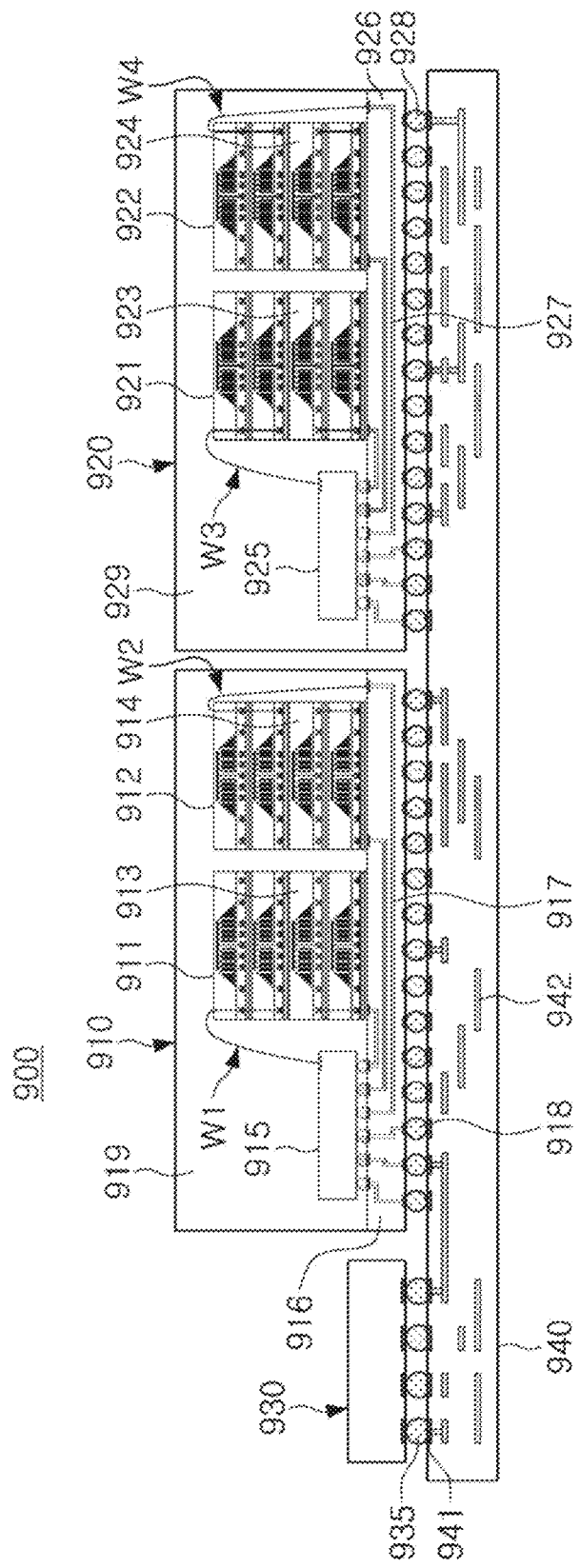
FIGS. 11 and 12 are views illustrating a storage device according to at least one example embodiment of the present disclosure.
Figure 12:
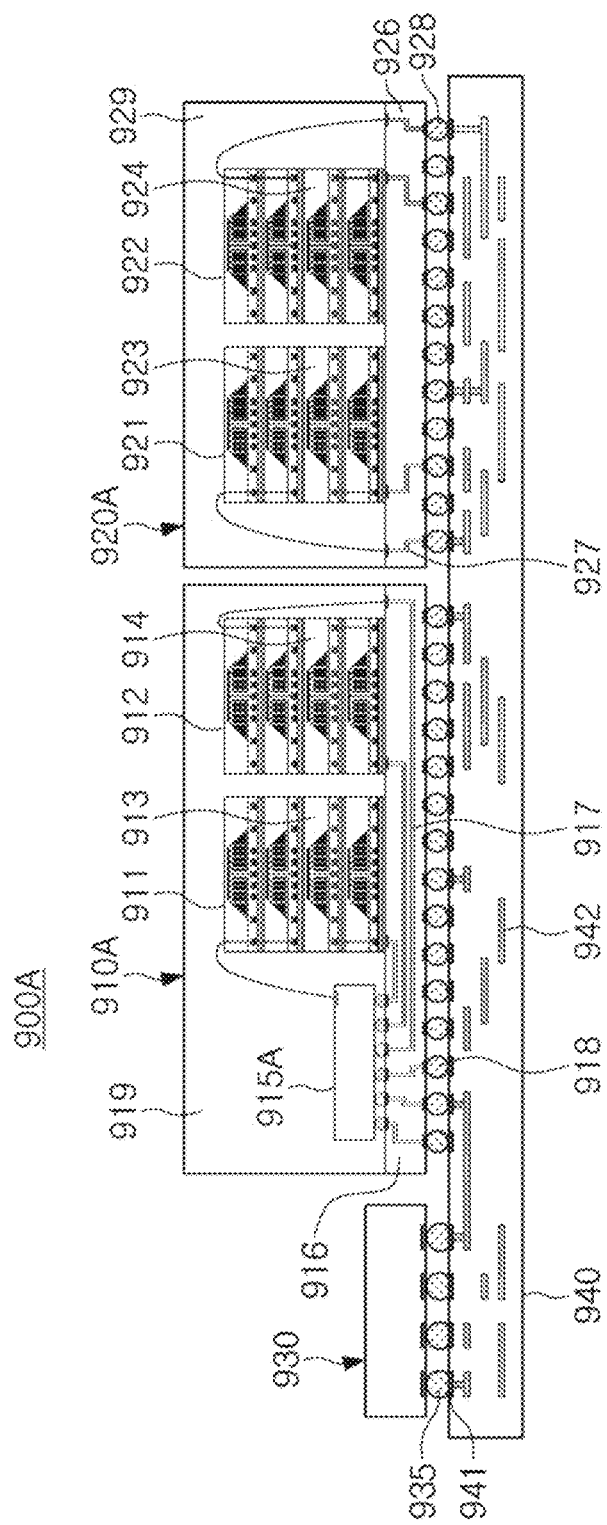

FIGS. 11 and 12 are views illustrating a storage device according to at least one example embodiment.

Referring to FIG. 11, a storage device 900 according to at least one example embodiment may include memory packages 910 and 920, a device controller 930, and a system substrate 940. The device controller 930 may be mounted on the system substrate 940 through the chip bumps 935, and the memory packages 910 and 920 may be mounted on the system substrate 940 through package bumps 918 and 928. The device controller 930 and the memory packages 910 and 920 may be electrically connected to each other through wirings 942 formed in the system substrate 940 and may exchange signals with each other. As an example, a signal generated by the device controller 930 to control the memory packages 910 and 920 and data to be stored in the memory chips disposed in the memory packages 910 and 920 may be transmitted to the memory chips through the wirings 942 and the buffer chips 915 and 925.

The memory packages 910 and 920 may have the same configuration. As for the first memory package 910 as an example, a plurality of memory chips, a buffer chip 915, and a first package substrate 916 may be included in the first memory package 910. The buffer chip 915 and the plurality of memory chips may be covered by a protective layer 919 disposed on the first package substrate 916. As for the second memory package 920 as an example, a plurality of memory chips, a buffer chip 925, and a second package substrate 926 may be included in the second memory package 920. The buffer chip 925 and the plurality of memory chips included in the second memory package 920 may be covered by a protective layer 929 disposed on the second package substrate 926.

The plurality of memory chips in the first memory package 910 may be divided into a plurality of groups 911 to 914 and may be connected to the buffer chip 915, and the buffer chip 915 may allocate channels to the plurality of groups 911 to 914 and may mediate signal transmission and reception between the controller 930 and the plurality of memory chips. For example, the memory chips of the first to fourth groups 911 to 914 may be connected to first to fourth channels of the buffer chip 915, respectively. In each of the plurality of groups 911 to 914, the memory chips may be alternately stacked and may be connected to each other by through wirings such as through silicon vias penetrating the memory chips. In example embodiments, the memory chips included in each of the plurality of groups 911 to 914 may be connected to each other by wires rather than through wirings.

In the example embodiment illustrated in FIG. 11, the memory chips of the first group 911 and the second group 912, disposed in a relatively upper portion, may be connected to the buffer chip 915 through the first wire W1 and the second wire W2. The memory chips of the first group 911 may be directly connected to the buffer chip 915 through the first wire W1. The memory chips of the second group 912 may be connected to the buffer chip 915 through the second wire W2 and the redistribution layer 917 disposed in the first package substrate 916. The memory chips of the third group 913 and the fourth group 914 disposed relatively in a lower portion may be connected to the buffer chip 915 through the redistribution layer 917 disposed in the first package substrate 916. To secure a connection path with the memory chips of the first to fourth groups 911 to 914, chip pads may be formed on both the upper and lower surfaces of the buffer chip 915.

As an example, the redistribution layer 917 may be electrically isolated from the package bumps 918. The redistribution layer 917 may connect the memory chips included in the third and fourth groups 913 and 914 in the first memory package 910 to the buffer chip 915. Accordingly, the redistribution layer 917 may not be electrically connected to the package bumps 918 for connecting the memory package 910 to the system substrate 940 and the other components mounted on the system substrate 940, the device controller 930, for example.

The package bumps 918 may be formed on a lower surface of the first package substrate 916, and the package bumps 918 may be connected to the chip bumps 935 of the device controller 930 through the upper bonding pad 941 and the wirings 942 of the system substrate 940. Accordingly, the first memory package 910 may be connected to the device controller 930.

In the example embodiment illustrated in FIG. 11, the second memory package 920 may have the same structure as the structure of the first memory package 910. Therefore, elements 921-929 included in the second memory package 920 may correspond to elements 911-919 included in the first memory package 910. For example, The plurality of memory chips in the second memory package 920 may be divided into a plurality of groups 921 to 924 and may be connected to the buffer chip 925, and the buffer chip 925 may allocate channels to the plurality of groups 921 to 924 and may mediate signal transmission and reception between the controller 930 and the plurality of memory chips. For example, the memory chips of the fifth to eighth groups 921 to 924 may be connected to fifth to eighth channels of the buffer chip 925, respectively. In each of the plurality of groups 921 to 924, the memory chips may be alternately stacked and may be connected to each other by through wirings such as through silicon vias penetrating the memory chips. In example embodiments, the memory chips included in each of the plurality of groups 921 to 924 may be connected to each other by wires rather than through wirings.

In the example embodiment illustrated in FIG. 11, the memory chips of the fifth group 921 and the sixth group 922, disposed in a relatively upper portion, may be connected to the buffer chip 925 through the third wire W3 and the fourth wire W4. The memory chips of the fifth group 921 may be directly connected to the buffer chip 925 through the third wire W3. The memory chips of the sixth group 922 may be connected to the buffer chip 925 through the fourth wire W4 and the redistribution layer 927 disposed in the first package substrate 926. The memory chips of the seventh group 923 and the eighth group 924 disposed relatively in a lower portion may be connected to the buffer chip 925 through the redistribution layer 927 disposed in the second package substrate 926. To secure a connection path with the memory chips of the fifth to eighth groups 921 to 924, chip pads may be formed on both the upper and lower surfaces of the buffer chip 925.

As an example, the redistribution layer 927 may be electrically isolated from the package bumps 928. The redistribution layer 927 may connect the memory chips included in the seventh and eighth groups 923 and 924 in the second memory package 920 to the buffer chip 925. Accordingly, the redistribution layer 927 may not be electrically connected to the package bumps 928 for connecting the second memory package 920 to the system substrate 940 and the other components mounted on the system substrate 940, the device controller 930, for example.

The package bumps 928 may be formed on a lower surface of the second package substrate 926, and the package bumps 928 may be connected to the chip bumps 935 of the device controller 930 through the upper bonding pad 941 and the wirings 942 of the system substrate 940. Accordingly, the second memory package 920 may be connected to the device controller 930.

In the storage device 900A according to the example embodiment illustrated in FIG. 12, the first memory package 910A and the second memory package 920A may have different structures. Referring to FIG. 12, only the first memory package 910A may include a buffer chip 915A, and the second memory package 920A may only include a plurality of memory chips divided into a plurality of groups 921 to 924. A plurality of memory chips included in the second memory package 920A may be connected to the buffer chip 915A of a first memory package 910A through a second package substrate 926 and a system substrate 940. For example, the memory chips of the second memory package 920A may be connected to the buffer chip 915A through a redistribution layer provided by a portion of the wirings 942 of the system substrate 940. Accordingly, signals and/or data generated by the device controller 930 to control the second memory package 920A may be transmitted to the memory chips of the second memory package 920A through the buffer chip 915A of the first memory package 910A.

In the example embodiment illustrated in FIG. 12, the buffer chip 915A may control a greater number of channels than the buffer chip 915 described in the aforementioned example embodiment illustrated in FIG. 11. As an example, the buffer chip 915A may control the memory chips of the first to fourth groups 911 to 914 included in the first memory package 910A through first to fourth channels, and may control the memory chips of the fifth to eighth groups 921 to 924 included in the second memory package 920A through fifth to eighth channels. The buffer chip 915A may select at least one of the first to eighth channels with reference to an address signal from among signals received from the device controller 930, and may transmit signals and data to the selected channel or may receive data from the memory chips through the selected channel and may transfer the data to the device controller 930.

Figure 13:
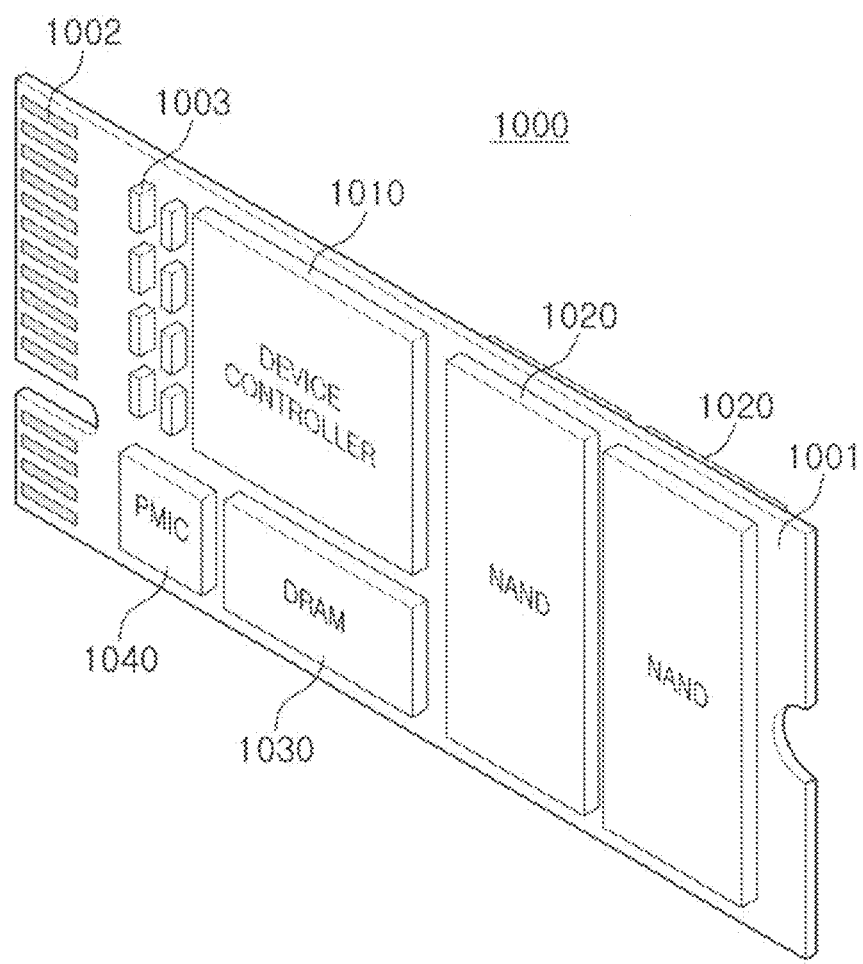
FIG. 13 is a view illustrating an exterior of a storage device according to at least one example embodiment of the present disclosure.

FIG. 13 is a view illustrating an exterior of a storage device according to at least one example embodiment.

A storage device 1000 according to the example embodiment illustrated in FIG. 13 may be implemented by a solid state drive (SSD), similarly to the example embodiment described with reference to FIG. 10. The storage device 1000 may communicate with an external central processing unit, a system-on-chip, an application processor, and the like. The form factor of the storage device 1000 and a protocol for communicating with an external device may be varied.

The storage device 1000 may include a system substrate 1001, connector pins 1002 and component elements 1003 formed on the system substrate 1001, a device controller 1010 mounted on the system substrate 1001, memory packages 1020, a DRAM 1030, and a PMIC 1040. In the example embodiment illustrated in FIG. 13, memory packages 1020 may be mounted on both surfaces of the system substrate 1001.

Capacity of the storage device 1000 may be increased by mounting the memory packages 1020 on both surfaces of the system substrate 1001. In example embodiments, every memory package 1020 may include a buffer chip, or alternatively, only at least one of the memory packages 1020 may include a buffer chip. In some example embodiments, the buffer chip may be shared by the memory chips of the memory packages 1020 which do not include the buffer chip. For example, the memory chips of the memory packages 1020 mounted on a first surface of the system substrate 1001 and the memory chips of the memory packages 1020 mounted on a second surface may share a single buffer chip through a redistribution layer disposed in the system substrate 1001. The configuration will be described in greater detail with reference to FIGS. 14 to 16.

Figure 14:
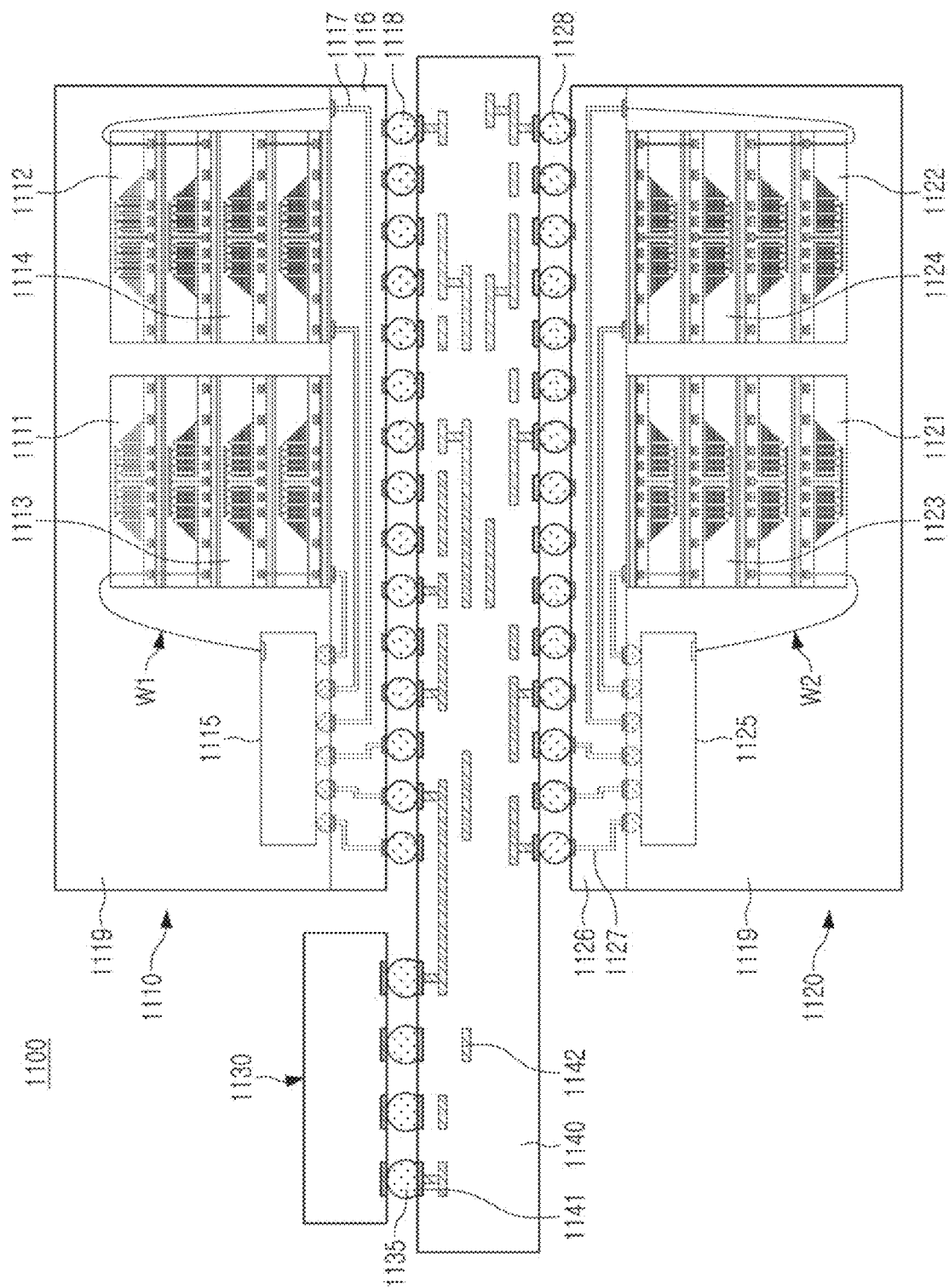
FIGS. 14 to 16 are views illustrating a storage device according to at least one example embodiment of the present disclosure.
Figure 15:
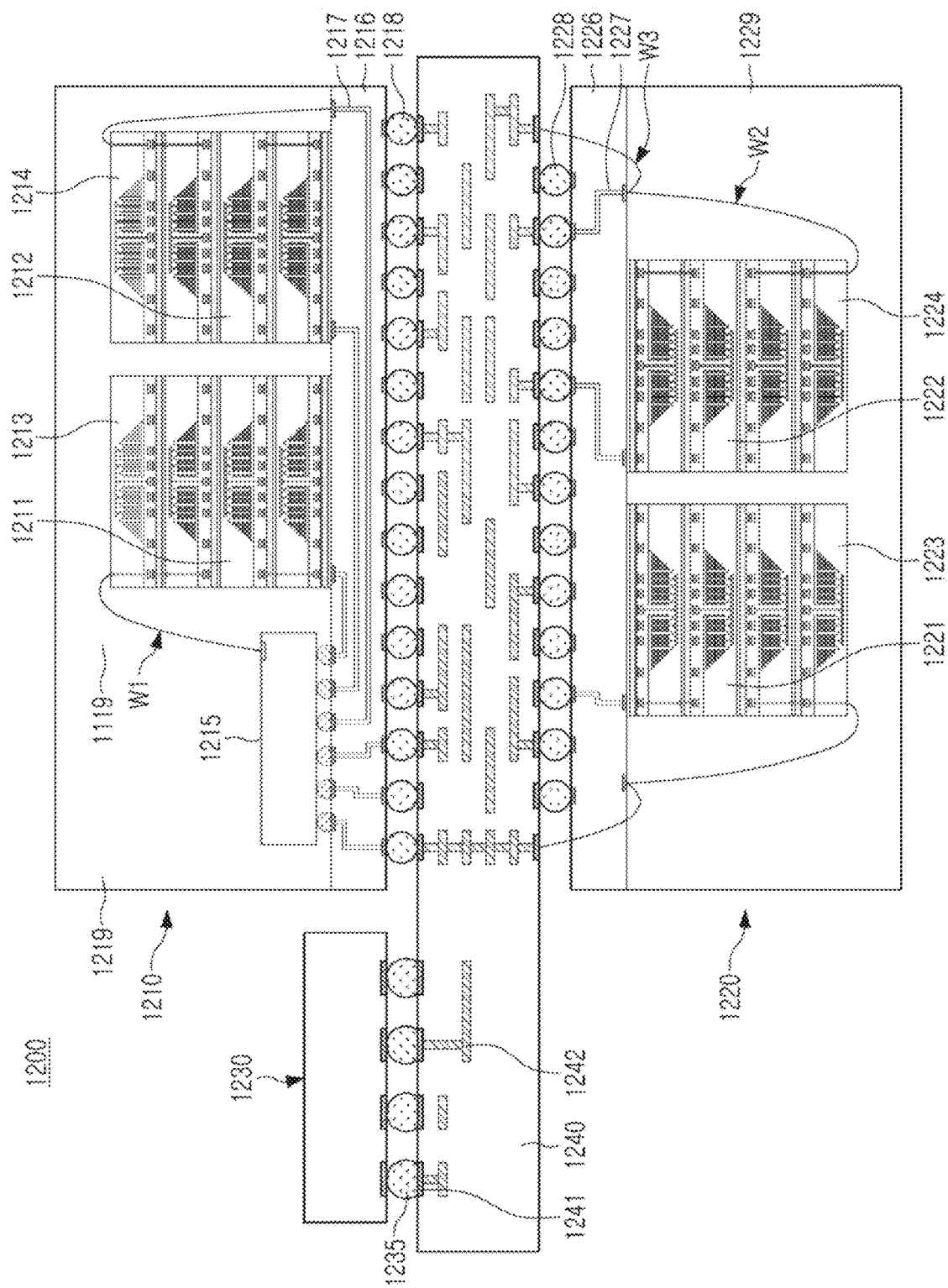
Figure 16:
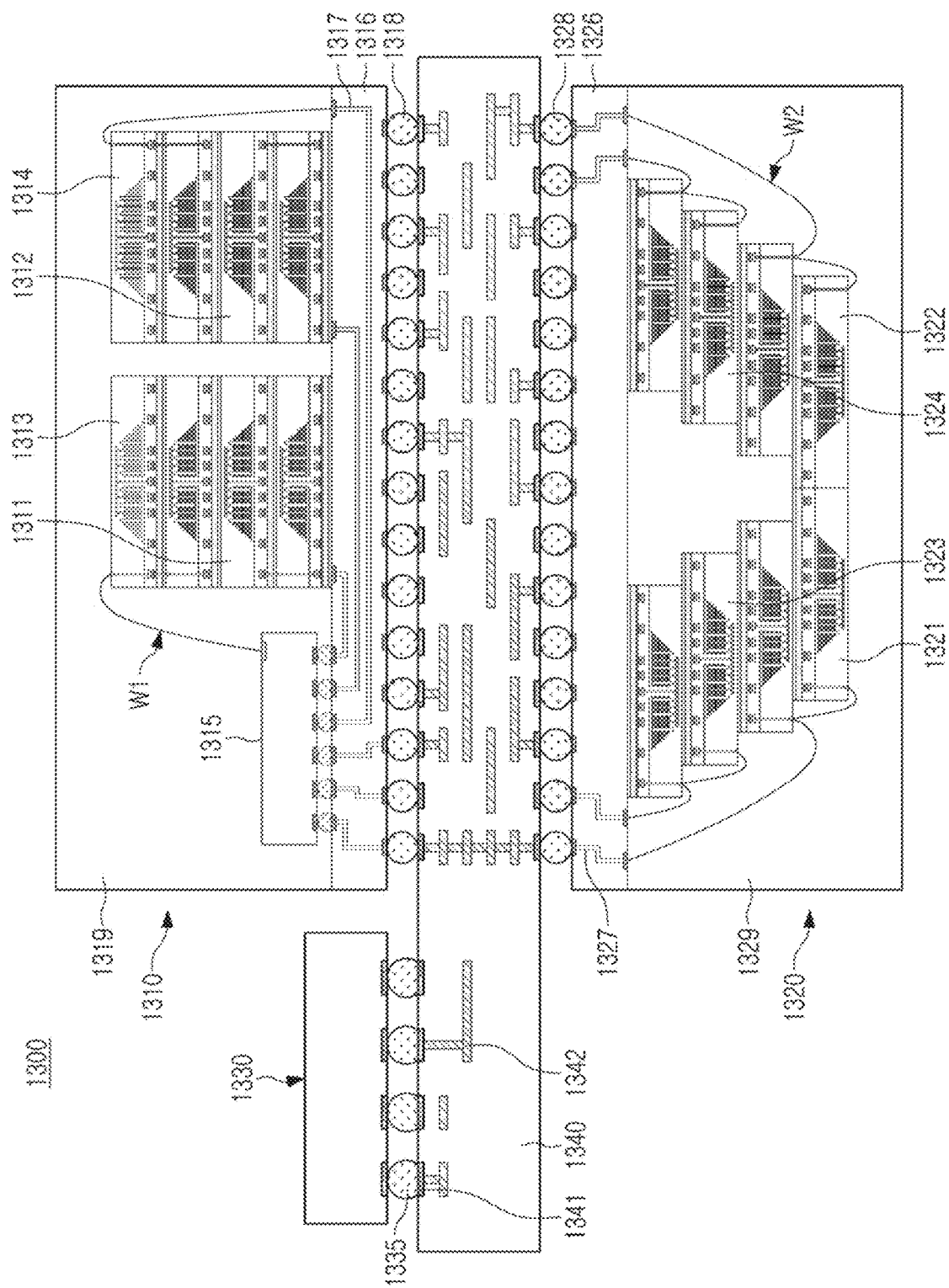

FIGS. 14 to 16 are views illustrating a storage device according to at least one example embodiment.

Referring to FIG. 14, a storage device 1100 according to at least one example embodiment may include memory packages 1110 and 1120, a device controller 1130, and a system substrate 1140. The device controller 1130 may be mounted on the system substrate 1140 through the chip bumps 1135, and the memory packages 1110 and 1120 may be mounted on both surfaces of the system substrate 1140 through the package bumps 1118 and 1128, respectively. As an example, the first memory package 1110 may be mounted on a first surface of the system substrate 1140 along with the device controller 1130, and the second memory package 1120 may be mounted on a second surface of the system substrate 1140. The first and second surfaces may oppose each other, as illustrated in FIG. 14.

The device controller 1130 and the memory packages 1110 and 1120 may be electrically connected to each other through wirings 1142 formed in the system substrate 1140 and may exchange signals. As an example, a signal generated by the device controller 1130 to control the memory packages 1110 and 1120, and data exchanged with the memory packages 1110 and 1120 may be transmitted through the wirings 1142.

The memory packages 1110 and 1120 may have the same configuration. As for the first memory package 1110 as an example, a plurality of memory chips classified into four groups 1111 to 1114, a buffer chip 1115, and a first package substrate 1116 may be included in the first memory package 1110. The buffer chip 1115 and the plurality of memory chips may be covered by a protective layer 1119 disposed on the first package substrate 1116. A method of connecting the plurality of memory chips to the buffer chip 1115 may be similar to the example described with reference to FIG. 11.

The device controller 1130 may generate a signal including a control command for storing data in memory chips or reading data stored in the memory chips, and may transmit the signal to at least one of the buffer chips 1115 and 1125. The buffer chips 1115 and 1125 may transmit a control command for storing or reading data to at least one of the memory chips based on address information included in the received signal.

In the example embodiment illustrated in FIG. 14, the first buffer chip 1115 and the second buffer chip 1125 may control memory chips through the same number of channels. Referring to FIG. 14, the memory chips may be divided into four groups in each of the memory packages 1110 and 1120. For example, memory chips of the first groups 1111 and 1112 may be connected to the first buffer chip 1115 and the second buffer chip 1125, by wires W1 and W2, respectively. Furthermore, memory chips of the second to fourth groups 1112 to 1114 and 1122 to 1124 may be connected to the first buffer chip 1115 and the second buffer chip 1125, by redistributions layers 1117 and 1127. Accordingly, each of the first buffer chip 1115 and the second buffer chip 1125 may mediate signal transmission and reception between the memory chips and the device controller 1130 through four channels.

Referring to FIG. 15, the storage device 1200 according to at least one example embodiment may include memory packages 1210 and 1220, a device controller 1230, and a system substrate 1240. In the example embodiment illustrated in FIG. 15, the first memory package 1210 and the second memory package 1220 may have different structures. For example, the first memory package 1210 may include a buffer chip 1215, whereas the second memory package 1220 may not include a buffer chip. The first memory package 1210 may have a similar structure with the memory packages in an example embodiment illustrated in FIG. 14, therefore, elements 1211-1219 included in the first memory package 1210 may be understood based on the description of FIG. 14 above.

The memory chips of the second memory package 1220 which do not include a buffer chip may be classified into four groups 1221-1224 and may be connected to the buffer chip 1215 of the first memory package 1210 through wirings 1242 disposed in the system substrate 1240. The memory chips of the second memory package 1220 may be covered by a protective layer 1229. The device controller 1230 may transmit a signal including a control command for controlling the memory chips of the second memory package 1220 to the buffer chip 1215, and the buffer chip 1215 may transmit the signal to the memory chips of the second memory package 1220 with reference to address information included in the signal. The memory chips of the second memory package 1220 may be connected to chip pads formed on a lower surface of the buffer chip 1215 through wirings 1242 disposed in the system substrate 1240, redistribution layers 1217 and 1227 disposed in the package substrates 1216 and 1226, and a chip bump 1218.

Accordingly, in the example embodiment illustrated in FIG. 15, differently from the example embodiment illustrated in FIG. 14, the number of channels connecting a single buffer chip 1215 to the memory chips may increase. In the example embodiment illustrated in FIG. 15, the memory chips in each of the memory packages 1210 and 1220 may be divided into four groups, and accordingly, the buffer chip 1215 may be connected to the memory chips through eight channels. The buffer chip 1215 may include a selection circuit which may select at least one of eight channels.

Referring to FIG. 15, a portion of the memory chips of the first memory package 1210 may be connected to the buffer chip 1215 through a first wire W1. A portion of the memory chips of the second memory package 1220 (the memory chips of the first and second groups 1221 and 1222, for example) may be connected to a lower bonding pad 1243 of the system substrate 1240 through a second wire W2 and a third wire W3. In at least one example embodiment, the second wire W2 may be configured to connect one of the memory chips to the second package substrate 1226, and the third wire W3 may be configured to connect the second package substrate 1226 to the system substrate 1240. A length of the third wire W3 may be shorter than lengths of the first wire W1 and the second wire W2. In example embodiments, the memory chips of the second memory package 1220 may be connected to the wirings 1242 of the system substrate 1240 through the redistribution layer 1227 disposed in the second package substrate 1226 and the package bumps 1228 without the third wire W3.

Referring to FIG. 16, a storage device 1300 according to at least one example embodiment may include memory packages 1310 and 1320, a device controller 1330, and a system substrate 1340. The memory packages 1310 and 1320 may be attached to the system substrate 1340 by package bumps 1318 and 1328. In the example embodiment illustrated in FIG. 16, the first memory package 1310 and the second memory package 1320 may have different structures. As an example, the first memory package 1310 may include a buffer chip 1315, whereas the second memory package 1320 may not include a buffer chip.

For example, in each of the memory packages 1310 and 1320, memory chips may be divided into four groups 1311 to 1314 and 1321 to 1324. In the first memory package 1310, the memory chips of the first and second groups 1311 and 1312 may be connected to the buffer chip 1315 through first wires W1, and memory chips of the third and fourth groups 1313 and 1314 may be connected to the buffer chip 1315 through a redistribution layers 1317 of a first package substrate 1316. In each of the first to fourth groups 1311 to 1314, the memory chips may be connected to each other by a through wiring such as a through silicon via.

Every memory chip of the second memory package 1320 may be connected to the system substrate 1340 by the second wires W2. Also, memory chips included in each of the first to fourth groups 1321 to 1324 of the second memory package 1320 may also be connected to each other through the second wires W2 instead of through wiring. The memory chips may be arranged in a staircase shape having stepped differences in at least one direction such that the memory chips may be connected to each other by the second wires W2. Accordingly, as illustrated in FIG. 16, the first memory package 1310 and the second memory package 1320 may have different structures.

Similarly to the aforementioned example embodiment described with reference to FIG. 15, in the example embodiment illustrated in FIG. 16, the memory chips of the second memory package 1320 may be connected to wirings 1342 disposed in the system substrate 1340 through a second wire W2 and a third wire W3, and may be connected to a buffer chip 1315 through wirings 1342. The second wire W2 may be configured to connect the memory chips to a redistribution layer 1327 of the second package substrate 1326, and the third wire W3 may be configured to connect the second package substrate 1326 to the system substrate 1340. A length of the second wire W2 may be longer than a length of the third wire W3.

Referring to FIG. 16, memory chips of the second memory package 1320 may be connected to the wirings 1342 disposed in the system substrate 1340 through package bumps 1328. In other words, as illustrated in FIG. 15, the memory chips of the second memory package 1320 may be connected to the wirings 1342 disposed in the system substrate 1340 through the package bumps 1328 rather than the third wire W3, and may be connected to the buffer chip 1315. However, at example embodiments are not limited thereto, and the memory chips of the second memory package 1320 may be connected to wirings disposed in the system substrate 1340 through the third wire W3 as illustrated in FIG. 15.

Figure 17:
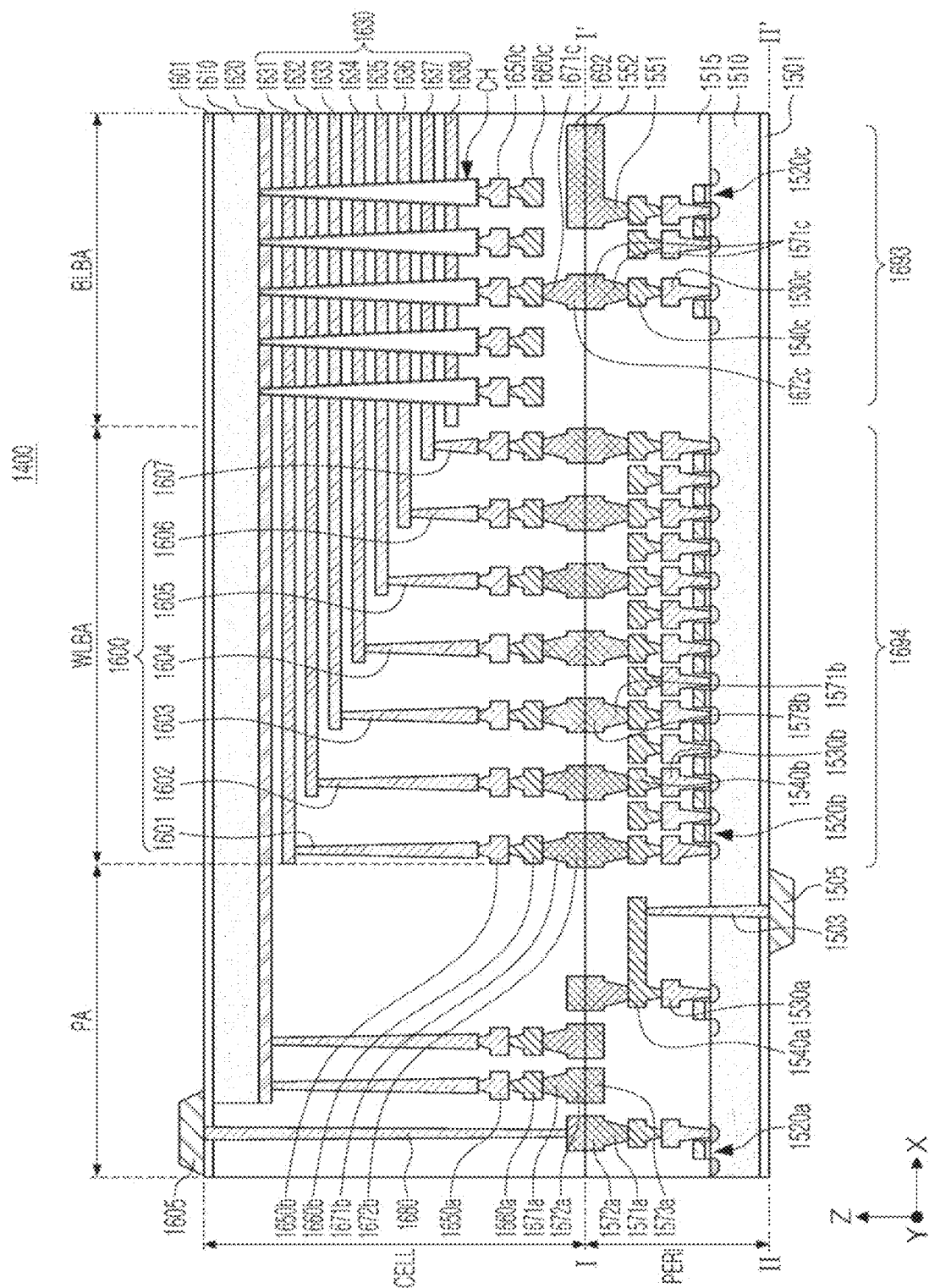
FIG. 17 is a memory device applicable to a memory package and a storage device according to at least one example embodiment of the present disclosure.

FIG. 17 is a memory device applicable to a memory package and a storage device according to at least one example embodiment.

Referring to FIG. 17, the memory device 1400 may have a chip to chip (C2C) structure. In the C2C structure, an upper chip including a cell area CELL may be manufactured on a first wafer, a lower chip including a peripheral circuit area PERI may be manufactured on a second wafer different from the first wafer, and the upper chip and the lower chip may be connected to each other by a bonding method. For example, the bonding method may refer to a method of electrically connecting a bonding metal formed on an uppermost metal layer of the upper chip to a bonding metal formed on an uppermost metal layer of the lower chip. For example, when the bonding metal is formed of copper (Cu), the bonding method may be a Cu to Cu bonding method, and the bonding metal may be formed of aluminum or tungsten.

Each of the peripheral circuit area PERI and the cell area CELL of the memory device 1400 may include an external pad bonding area PA, a word line bonding area WLBA, and a bit line bonding area BLBA.

The peripheral circuit area PERI may include a first substrate 1510, an interlayer insulating layer 1515, a plurality of circuit elements 1520a, 1520b, and 1520c formed on the first substrate 1510, first metal layers 1530a, 1530b, and 1530c connected to the plurality of device elements 1520a, 1520b, and 1520c, and second metal layers 1540a, 1540b, and 1540c formed on the first metal layers 1530a, 1530b, and 1530c. In at least one example embodiment, the first metal layers 1530a, 1530b, and 1530c may be formed of tungsten having relatively high resistance, and the second metal layers 1540a, 1540b, and 1540c may be formed of copper having relatively low resistance.

In the example embodiment, only the first metal layers 1530a, 1530b, and 1530c and the second metal layers 1540a, 1540b, and 1540c are illustrated and described, but example embodiments are not limited thereto. At least one or more metal layers may be formed on the second metal layers 1540a, 1540b, and 1540c. At least a portion of the one or more metal layers formed on the second metal layers 1540a, 1540b, and 1540c may be formed of aluminum having resistance lower than that of copper forming the second metal layers 1540a, 1540b, and 1540c.

An interlayer insulating layer 1515 may be disposed on the first substrate 1510 to cover the plurality of circuit elements 1520a, 1520b, and 1520c, the first metal layers 1530a, 1530b, and 1530c, and the second metal layers 1540a, 1540b, and 1540c, and may include an insulating material such as silicon oxide or silicon nitride.

Lower bonding metals 1571b and 1572b may be formed on the second metal layer 1540b of a word line bonding area WLBA. In the word line bonding area WLBA, the lower bonding metals 1571b and 1572b of the peripheral circuit area PERI may be electrically connected to the upper bonding metals 1671b and 1672b of the cell area CELL by a bonding method, and the lower bonding metals 1571b and 1572b and the upper bonding metals 1671b and 1672b may be formed of aluminum, copper, or tungsten.

The cell area CELL may provide at least one memory block. The cell area CELL may include a second substrate 1610 and a common source line 1620. A plurality of word lines 1631 to 338 (330) may be stacked on the second substrate 1610 in a direction (Z-axis direction) perpendicular to an upper surface of the second substrate 1610. String select lines and ground select lines may be disposed above and below the word lines 1630, and a plurality of word lines 1630 may be disposed between the string select lines and the ground select line.

In the bit line bonding area BLBA, the channel structure CH may extend in a direction perpendicular to an upper surface of the second substrate 1610 and may penetrate the word lines 1630, the string select lines, and the ground select lines. The channel structure CH may include a data storage layer, a channel layer, and a buried insulating layer, and the channel layer may be electrically connected to the first metal layer 1650c and the second metal layer 1660c. For example, the first metal layer 1650c may be a bit line contact, and the second metal layer 1660c may be a bit line. In at least one example embodiment, the bit line 1660c may extend in a first direction (Y-axis direction) parallel to the upper surface of the second substrate 1610.

In the example embodiment illustrated in FIG. 17, an area in which the channel structure CH and the bit line 1660c are disposed may be defined as a bit line bonding area BLBA. The bit line 1660c may be electrically connected to the circuit elements 1520c providing a page buffer 1693 in the peripheral circuit area PERI in the bit line bonding area BLBA. As an example, the bit line 1660c may be connected to the upper bonding metals 1671c and 1672c in the peripheral circuit area PERI, and the upper bonding metals 1671c and 1672c may be connected to the lower bonding metals 1571c and 1572c connected to the circuit elements 1520c of the page buffer 1693.

In the word line bonding area WLBA, the word lines 1630 may extend in a second direction (X-axis direction) parallel to the upper surface of the second substrate 1610, and may be connected to a plurality of cell contact plugs 1641 to 347 (340). The word lines 1630 and the cell contact plugs 1640 may be connected to pads provided by extending at least a portion of the word lines 1630 by different lengths in the second direction. The first metal layer 1650b and the second metal layer 1660b may be connected in order to an upper portion of the cell contact plugs 1640 connected to the word lines 1630. The cell contact plugs 1640 may be connected to the peripheral circuit area PERI through the upper bonding metals 1671b and 1672b of the cell area CELL and the lower bonding metals 1571b and 1572b of the peripheral circuit area PERI in the word line bonding area WLBA.

The cell contact plugs 1640 may be electrically connected to circuit elements 1520b providing a row decoder 1694 in the peripheral circuit area PERI. In at least one example embodiment, operating voltages of the circuit elements 1520b providing the row decoder 1694 may be different from operating voltages of the circuit elements 1520c providing the page buffer 1693. For example, the operating voltages of the circuit elements 1520c providing the page buffer 1693 may be greater than the operating voltages of the circuit elements 1520b providing the row decoder 1694.

A common source line contact plug 1680 may be disposed in the external pad bonding area PA. The common source line contact plug 1680 may be formed of a conductive material such as a metal, a metal compound, or polysilicon, and may be electrically connected to the common source line 1620. The first metal layer 1650a and the second metal layer 1660a may be stacked in order on the common source line contact plug 1680. For example, an area in which the common source line contact plug 1680, the first metal layer 1650a, and the second metal layer 1660a are disposed may be defined as an external pad bonding area PA.

Input and output pads 1505 and 1605 may be disposed in the external pad bonding area PA. Referring to FIG. 17, a lower insulating layer 1501 covering a lower surface of the first substrate 1510 may be formed below the first substrate 1510, and a first input and output pad 1505 may be formed on the lower insulating layer 1501. The first input and output pad 1505 may be connected to at least one of the plurality of circuit elements 1520a, 1520b, and 1520c disposed in the peripheral circuit area PERI through the first input and output contact plug 1503, and may be isolated from the first substrate 1510 by the lower insulating layer 1501. Also, a lateral-surface insulating layer may be disposed between the first input and output contact plug 1503 and the first substrate 1510 and may electrically isolate the first input and output contact plug 1503 from the first substrate 1510.

Referring to FIG. 17, an upper insulating layer 1601 covering an upper surface of the second substrate 1610 may be formed on the second substrate 1610, and a second input and output pad may be disposed on the upper insulating layer 1601. The second input and output pad 1605 may be connected to at least one of the plurality of circuit elements 1520a, 1520b, and 1520c disposed in the peripheral circuit area PERI through the second input and output contact plug 1603.

In example embodiments, the second substrate 1610 and the common source line 1620 may not be disposed in an area in which the second input and output contact plug 1603 is disposed. Also, the second input and output pad 1605 may not overlap the word lines 1680 in a third direction (Z-axis direction). Referring to FIG. 17, the second input and output contact plug 1603 may be isolated from the second substrate 1610 in a direction parallel to the upper surface of the second substrate 1610, and may penetrate the interlayer insulating layer 1615 of the cell area CELL and may be connected to the second input and output pad 1605.

In example embodiments, the first input and output pad 1505 and the second input and output pad 1605 may be selectively formed. For example, the memory device 1400 may only include the first input and output pad 1505 disposed on the first substrate 1501, or may only include the second input and output pad 1605 disposed on the second substrate 1601. Alternatively, the memory device 1400 may include both the first input and output pad 1505 and the second input and output pad 1605.

In each of the external pad bonding area PA and the bit line bonding area BLBA included in the cell area CELL and the peripheral circuit area PERI, respectively, the metal pattern of the uppermost metal layer may be provided as a dummy pattern, or the uppermost metal layer may be empty.

The memory device 1400 may include a lower metal pattern 1576a having the same shape as a shape of the upper metal pattern 1672a of the cell area CELL on the uppermost metal layer of the peripheral circuit area PERI to correspond to the upper metal pattern 1672a formed on the uppermost metal layer of the cell area CELL. The lower metal pattern 1576a formed on the uppermost metal layer of the peripheral circuit area PERI may not be connected to a contact in the peripheral circuit area PERI. Similarly, an upper metal pattern having the same shape as the shape of the lower metal pattern of the peripheral circuit area PERI may be formed on the upper metal layer of the cell area CELL to correspond to the lower metal pattern formed on the uppermost metal layer of the peripheral circuit area PERI in the external pad bonding area PA.

Lower bonding metals 1571b and 1572b may be formed on the second metal layer 1540b of the word line bonding area WLBA. In the word line bonding area WLBA, the lower bonding metals 1571b and 1572b of the peripheral circuit area PERI may be electrically connected to each other with the upper bonding metals 1671b and 1672b of the cell area CELL by a bonding method.

Also, in the bit line bonding area BLBA, an upper metal pattern having the same shape as the shape of the lower metal pattern 1552 of the peripheral circuit area PERI may be formed on the uppermost metal layer of the cell area CELL to correspond to the lower metal pattern 1552 formed on the uppermost metal layer of the peripheral circuit area PERI in the bit line bonding area BLBA. A contact may not be formed on the upper metal pattern 1692 formed on the uppermost metal layer of the cell area CELL.

The memory device 1400 according to the example embodiment illustrated in FIG. 17 may be applied to the memory package and the storage device described in the aforementioned embodiments. For example, the memory device 1400 described with reference to FIG. 17 may be applied to the memory package 600 illustrated in the example embodiment in FIG. 8 as the memory chips MC. As an example, the memory chips MC included in the first group 610 or the second group 620 may be alternately stacked, and may be electrically connected to each other through the input and output pads 205 and 305.

According to the aforementioned example embodiments, the number of memory chips connected to a single buffer chip may be increased using the redistribution layer of the package substrate, and accordingly, the storage space of the memory package may be effectively increased. Also, different memory packages may share a single buffer chip using the redistribution layer of the system substrate included in the storage device, and without increasing the number of the buffer chips and/or the device controllers, the storage space of the storage device may be increased.

While the example embodiments have been illustrated and described above, it will be apparent to those skilled in the art that modifications and variations could be made without departing from the scope of the present disclosure as defined by the appended claims.

What is claimed is:

1. A memory package, comprising:
a package substrate including a plurality of redistribution layers and bonding pads connected to the plurality of redistribution layers, the plurality of redistribution layers including at least a first and second redistribution layer, each of the plurality of redistribution layers including a plurality of signal paths;
a buffer chip mounted on the package substrate and including a plurality of chip pads corresponding to a plurality of memory channels, the buffer chip configured to receive a control command from an external device controller through at least a portion of the plurality of signal paths of the first redistribution layer; and
a plurality of memory chips stacked on the package substrate and divided into a plurality of groups corresponding to the plurality of memory channels,
wherein memory chips of a first group, among the plurality of memory chips, are connected to first chip pads of the plurality of chip pads through first wires, and
wherein memory chips of a second group, among the plurality of memory chips, are connected to second chip pads of the plurality of chip pads through second wires and at least a portion of the plurality of signal paths of the second redistribution layer.

2. The memory package of claim 1, wherein the buffer chip is configured to transmit a control command received from an external device controller to two or more groups corresponding to two or more of the plurality of memory channels.

3. The memory package of claim 1, wherein memory chips of a third group, among the plurality of memory chips, are connected to third chip pads of the plurality of chip pads through third wires.

4. The memory package of claim 3, wherein memory chips of a fourth group, among the plurality of memory chips, are connected to fourth chip pads of the plurality of chip pads through fourth wires and another portion of the plurality of signal paths, different than the at least one portion of the plurality of signal paths.

5. The memory package of claim 1, wherein a number of the memory chips of the first group is the same as a number of the memory chips of the second group.

6. The memory package of claim 1, wherein the memory chips of the first group and the memory chips of the second group are disposed in different positions in a direction parallel to an upper surface of the package substrate.

7. The memory package of claim 6, wherein the memory chips of the first group and the memory chips of the second group are disposed at the same level in a direction perpendicular to the upper surface of the package substrate.

8. The memory package of claim 1, wherein the memory chips of the first group are connected to each other by through wirings, and the through wirings are connected to the first wires.

9. The memory package of claim 1, wherein the buffer chip includes a plurality of transmitters and a plurality of receivers connected to the plurality of chip pads, and each of the plurality of chip pads is connected to one of the plurality of transmitters and one of the plurality of receivers.

10. The memory package of claim 9,
wherein the buffer chip includes a selection circuit for selecting at least one of the plurality of chip pads, and
wherein the buffer chip is configured to activate the transmitter and the receiver connected to a chip pad selected by the selection circuit among the plurality of chip pads, and to deactivate the transmitter and the receiver connected to chip pads not selected by the selection circuit.

11. The memory package of claim 1,
wherein the plurality of chip pads include upper chip pads disposed on an upper surface of the buffer chip, and lower chip pads disposed on a lower surface of the buffer chip, and
wherein the upper chip pads include the first chip pads.

12. The memory package of claim 11, wherein the lower chip pads include the second chip pads, and the second chip pads are directly connected to the at least a portion of the plurality of signal paths.

13. The memory package of claim 11,
wherein memory chips of a third group, among the plurality of memory chips, are disposed between the memory chips of the second group and the package substrate, and
wherein the memory chips of the third group are connected to third chip pads included in the lower chip pads through the other portion of the plurality of signal paths.

14. A storage device, comprising:
a system substrate;
device controller circuitry mounted on the system substrate; and
a plurality of memory packages mounted on the system substrate and configured to operate in response to a control command received from the device controller circuitry,
wherein each of the plurality of memory packages includes a package substrate connected to the system substrate, a single buffer chip mounted on the package substrate, and a plurality of memory chips connected to the buffer chip through the plurality of memory channels, the package substrate including a plurality of redistribution layers and bonding pads connected to the plurality of redistribution layers, the plurality of redistribution layers including at least a first and second redistribution layer, each of the plurality of redistribution layers including a plurality of signal paths, the single buffer chip configured to receive the control command from the device controller circuitry through at least a portion of the plurality of signal paths of the first redistribution layer and out the control command to at least one of a plurality of channels, and the plurality of memory chips connected to the buffer chip through the plurality of memory channels,
wherein memory chips of a first group, among the plurality of memory chips, are electrically connected to the buffer chip through first wires, and
wherein memory chips of a second group, among the plurality of memory chips, are electrically connected to the buffer chip through second wires and the second redistribution layer.

15. The memory package of claim 14,
wherein the buffer chip includes a plurality of chip pads, and the plurality of chip pads include upper chip pads disposed on an upper surface of the buffer chip, and lower chip pads disposed on a lower surface of the buffer chip,
wherein the upper chip pads are electrically connected to the memory chips of the first group through the first wires, and
wherein the lower chip pads are electrically connected to the memory chips of the second group through the second wires and the second redistribution layer.

16. The memory package of claim 14,
wherein the memory chips of the first group are connected to each other by the first wires, and
wherein the memory chips of the second group are connected to each other by the second wires.

17. The memory package of claim 14, wherein the memory chips of the first group are connected to each other through first through silicon vias, and the memory chips of the second group are connected to each other through second through silicon vias.

18. The memory package of claim 14, wherein the buffer chip includes a selection circuit configured to activate at least one of the plurality of channels and to output the control command to at least one of the memory chips.

19. The memory package of claim 14,
wherein each of the plurality of memory packages is mounted on the system substrate through a plurality of package bumps formed on a lower surface of the package substrate, and
wherein the package bumps and the plurality of redistribution layers are electrically isolated from each other.

20. A storage device, comprising:
a system substrate including a plurality of redistribution layers, the plurality of redistribution layers including at least a first and second redistribution layer, each of the plurality of redistribution layers including a plurality of channels,
device controller circuitry mounted on the system substrate; and
a plurality of memory packages mounted on the system substrate and configured to operate in response to a control command received from the device controller circuitry,
wherein each of the memory packages includes a package substrate connected to the system substrate and including a plurality of bonding pads, and a plurality of memory chips mounted on the package substrate,
wherein a first memory package of the memory packages includes a buffer chip connected to the memory chips through a plurality of channels and transmitting the control command received from the device controller circuitry to the memory chips through at least one of the channels of the first redistribution layer,
wherein the buffer chip includes a plurality of chip pads, and
wherein at least one of the chip pads is connected to the memory chips of a second memory package which does not include the buffer chip among the memory packages through wires and at least a portion of the channels of the second redistribution layer.

\* \* \* \* \*